United States Patent [19]

Shiraishi

[11] Patent Number: 5,621,500
[45] Date of Patent: Apr. 15, 1997

[54] METHOD AND APPARATUS FOR PROJECTION EXPOSURE

[75] Inventor: Naomasa Shiraishi, Kanagawa-ken, Japan

[73] Assignee: Nikon Corporation, Tokyo, Japan

[21] Appl. No.: 450,238

[22] Filed: May 25, 1995

[51] Int. Cl.⁶ .................................................. G03B 27/72
[52] U.S. Cl. ............................................... 355/71; 355/53
[58] Field of Search ................................. 355/53, 77, 52, 355/55, 71

[56] References Cited

U.S. PATENT DOCUMENTS

| | | | |
|---|---|---|---|
| 4,794,426 | 12/1988 | Nishi | 355/43 |
| 4,906,081 | 3/1990 | Yasuda | 350/439 |
| 5,117,255 | 5/1992 | Shiraishi et al. | 355/53 |
| 5,144,362 | 9/1992 | Kamon et al. | |
| 5,255,050 | 10/1993 | Kitagawa | |
| 5,348,837 | 9/1994 | Fukuda et al. | 430/269 |

FOREIGN PATENT DOCUMENTS

| | | |
|---|---|---|
| 0485062 | 5/1992 | European Pat. Off. |
| 62-50811 | 10/1987 | Japan |
| 4-101148 | 4/1992 | Japan |
| 4-179958 | 6/1992 | Japan |
| 5-175165 | 7/1994 | Japan |

OTHER PUBLICATIONS

H. Fukuda et al., "Super–FLEX", Extended Abstracts (Spring Meeting, 1991) 29a–ZC–8, 9; The Japan Society of Applied Physics.

"Research on Imaging Capability and Improved Procedure Thereof in Optical System and Method of Improving the Same", Machine Testing Institute Report No. 40, Jan. 23, 1961, pp. 41–55.

*Primary Examiner*—Arthur T. Grimley
*Assistant Examiner*—Herbert V. Kerner
*Attorney, Agent, or Firm*—Armstrong, Westerman, Hattori, McLeland & Naughton

[57] ABSTRACT

A projection exposure method wherein a mask (R) is illuminated with illuminating light (ILB) for exposure, and an image of the mask pattern is projected onto a photosensitive substrate (W) through a projection optical system (PL). A phase plate is disposed on a Fourier transform plane (FTP) of the projection optical system (PL) or on a plane near the Fourier transform plane. The circular region of the phase plate of radius r2 is divided into a central circular region (FA) and a peripheral annular region (FB) when the pattern image of the mask (R) is to be transferred onto the substrate (W) by successively carrying out three divided exposure operations such that the position of the substrate (W) relative to the position of the image-forming plane of the projection optical system (PL) is changed in the optical axis direction by a distance d at a time, the distance d is set at a value which is determined according to the numerical aperture of the projection optical system (PL) and the wavelength of the illuminating light. Moreover, the amounts of exposure for two of the three divided exposure operations which are carried out at two opposite extremity positions of the exposure range in the optical axis direction are set substantially equal to each other, and the amount of exposure for one of the three divided exposure operations which is carried out at an intermediate position in the optical axis direction is set according to the distance d.

14 Claims, 13 Drawing Sheets

— BEST FOCUS
--- ±1μm DEFOCUS
---- ±2μm DEFOCUS

— BEST FOCUS
—·— ±1μm DEFOCUS
---- ±2μm DEFOCUS

— BEST FOCUS
--- ±1 µm DEFOCUS
-·-· ±2 µm DEFOCUS

— BEST FOCUS
—·— ±1 μm DEFOCUS
—--— ±2 μm DEFOCUS

METHOD AND APPARATUS FOR PROJECTION EXPOSURE

BACKGROUND OF THE INVENTION

The present invention relates to a method and apparatus for projection exposure used for forming fine patterns in semiconductor integrated circuits, liquid crystal displays, etc., by photolithography processes. More particularly, the present invention relates to a method and apparatus for projection exposure which may be effectively applied to a process for forming contact hole patterns which are close to each other.

A projection exposure apparatus is used for forming fine patterns in semiconductor integrated circuits, liquid crystal displays, etc., by photolithography processes. A projection optical system used in such a projection exposure apparatus is incorporated in the apparatus after high-level optical designing, careful selection of a glassy material, ultraprecise processing, and precise assembly adjustment. The present semiconductor manufacturing process mainly uses a stepper in which a reticle (or a photomask or the like) is irradiated with the i-line (wavelength: 365 nm) of a mercury-vapor lamp as illuminating light, and light passing through a circuit pattern on the reticle is focused on a wafer (or a photosensitive substrate), which has a photoresist coated thereon, through a projection optical system. Recently, an excimer stepper that employs excimer laser light (KrF laser light of wavelength 248 nm) as illuminating light has also been used.

Generally speaking, to faithfully transfer a fine reticle pattern onto a photosensitive substrate by exposure using a projection optical system, the resolution and focal depth or depth of focus (DOF) of the projection optical system are important factors. Among projection optical systems which are presently put to practical use, there is a projection optical system having a numerical aperture (NA) of about 0.6 and employing the i-line. In general, when the wavelength of illuminating light employed is kept constant, as the numerical aperture of the projection optical system is increased, the resolution improves correspondingly. In general, however, the focal depth (DOF) decreases as the numerical aperture NA increases. The focal depth is defined by $DOF=\pm\lambda/NA^2$, where $\lambda$ is the wavelength of illuminating light. It should be noted that when the illuminating light is reduced in wavelength, the resolution improves, but the focal depth decreases with the reduction in wavelength in the same way as in the case of the numerical aperture.

In the meantime, even if the resolution is improved by increasing the numerical aperture NA of the projection optical system, the focal depth (focus margin) DOF decreases in inverse proportion to the square of the numerical aperture, as shown in the above expression of $DOF=\pm\lambda/NA^2$. Accordingly, even if a projection optical system having a high numerical aperture can be produced, the required focal depth cannot be obtained; this is a great problem in practical use. Assuming that the wavelength of illuminating light is 365 nm of the i-line and the numerical aperture is 0.6, the focal depth DOF becomes a relatively small value, i.e., about 1 µm (±0.5 µm) in width. Accordingly, resolution decreases in a portion where the surface unevenness or the curvature is greater than DOF within one shot region (which is about 20 by 20 mm or 30 by 30 mm square) on the wafer.

To solve the above-described problems of the projection optical system, there have been proposed a phase shift reticle method (which uses a reticle provided with a phase shifter) such as that disclosed in Japanese Patent Examined Publication No. 62-50811, and a SHRINC (Super High-Resolution by Illumination Control) method such as that disclosed in Japanese Patent Unexamined Publication (KOKAI) Nos. 04-101148 and 04-225358. These methods are suitable for improving the resolution and the depth of focus in the process for transferring a pattern formed on the reticle, particular a periodic pattern, e.g., a line-and-space pattern (L&S pattern) or a grating pattern. However, no effect can be obtained for isolated patterns (in which the distance between patterns is relatively large), for example, contact hole patterns (fine square patterns).

Therefore, in order to enlarge the apparent focal depth for isolated patterns, e.g., contact hole patterns, an exposure method has been proposed in which for each shot region on a wafer, the wafer is stepwisely moved along the optical axis by a predetermined amount at a time, and exposure is carried out for each stop position of the wafer, that is, exposure is carried out a plurality of times for each shot region. For example, see Japanese Patent Unexamined Publication (KOKAI) No. 63-42122 (corresponding to U.S. Pat. No. 4,869,999). This exposure method is called FLEX (Focus Latitude enhancement EXposure) method and provides satisfactory focal depth enlarging effect for isolated patterns, e.g., contact hole patterns. However, the FLEX method indispensably requires multiple exposure of contact hole pattern images which are slightly defocused. Therefore, both the sharpness of a composite optical image obtained by the multiple exposure and a resist image obtained after development inevitably decrease. Accordingly, the FLEX method suffers from problems such as degradation of the resolution of contact hole patterns which are close to each other, and lowering of the margin for the variation of the exposure degree (i.e., exposure margin).

It should be noted that the FLEX method is also disclosed in Japanese Patent Unexamined Publication (KOKAI) No. 05-18805 (corresponding to U.S. patent application Ser. No. 820,244, filed by the present applicant; in which the wafer is moved along the optical axis continuously during exposure), and U.S. Pat. No. 5,255,050.

As another conventional technique, there has recently been proposed a technique in which a pupil filter is provided in a pupil plane of a projection optical system, that is, a plane of the projection optical system that is in Fourier transform relation to both the reticle pattern surface and the wafer surface, in an image-forming optical path between the reticle and the wafer, thereby improving the resolution and the focal depth. Examples of this technique include the Super-FLEX method published in Extended Abstracts (Spring Meeting, 1991) 29a-ZC-8, 9; The Japan Society of Applied Physics. This method is also disclosed in EP-485062A. In the Super-FLEX method, a transparent phase plate is provided at the pupil of a projection optical system so that the complex amplitude transmittance that is given to image-forming light by the phase plate successively changes from the optical axis toward the periphery in the direction perpendicular to the optical axis. By doing so, the image that is formed by the projection optical system maintains its sharpness with a predetermined width (wider than that in the conventional method) in the optical axis direction about the best focus plane (a plane that is conjugate with respect to the reticle) which is the center of said predetermined width. Thus, the focal depth increases. It should be noted that the pupil filter used in the Super-FLEX method, that is, so-called multifocus filter, is detailed in the paper entitled "Research on Imaging Performance of Optical System and Method of Improving the Same", pp. 41–55, in Machine Testing Institute Report No. 40, issued on Jan. 23, 1961. As to the pupil filter itself, please see U.S. Pat. No. 5,144,362.

The present applicant has proposed in Japanese Patent Unexamined Publication (KOKAI) No. 04-179958 a pupil filter for contact hole patterns which is designed to block the light passing at the central portion (in the vicinity of the optical axis) of the pupil plane, unlike the above-described filter that gives a change in phase of the transmitted light.

However, the conventional Super-FLEX method suffers from the problem that the intensity of a subsidiary peak (ringing) which occurs in the vicinity of a contact hole pattern becomes relatively strong, although the method provides satisfactory focal depth increasing effect for isolated contact hole patterns. Therefore, in the case of a plurality of contact hole patterns which are relatively close to each other, an undesirable ghost pattern is transferred to a position where ringings occurring between adjacent contact holes overlap each other, causing an undesired reduction in film thickness of the photoresist.

In this regard, the present applicant made analysis in order to determine optimal conditions for projection exposure when carried out by jointly using the above-described various pupil filter techniques and the FLEX method, and disclosed the results of the analysis in Japanese Patent Application Nos. 05-175164 and 05-175165 (corresponding to U.S. patent application Ser. No. 274,752, filed by the present applicant). These inventions provide a method which is extremely useful for the transfer or the projection exposure of contact hole patterns which are relatively close to each other, as described above. In this method, however, the exposure process comprises a plurality of divided exposure operations which are successively carried out for each shot region, and a plurality of exposure positions for the exposure process are uniquely determined by the wavelength of exposure light and the NA (Numerical Aperture) of the projection optical system. Therefore, a depth of focus which is larger than the optimal depth of focus may be obtained, or the amount of exposure (exposure time) required for the pattern transfer may increase according to the conditions. Consequently, the processing capacity (throughput) reduces disadvantageously.

SUMMARY OF THE INVENTION

It is an object of the present invention to provide a projection exposure method which employs a phase type pupil filter disposed at a Fourier transform plane in a projection optical system. The phase type pupil filter has a central circular region (FA) of radius r1 and a peripheral annular region (FB) of radius r2 which lies around the central circular region (FA). The ratio r1/r2 of the radius r1 to the radius r2 is set at a proper value with respect to the amplitude transmittance ratio t of the two regions (FA and FB). In the projection exposure method, exposure for each shot region is carried out by successively performing three divided exposure operations (i.e., FLEX method) at three different positions spaced apart from each other by a distance d, which distance d is set at a proper value according to the numerical aperture NA and the wavelength $\lambda$ of illuminating light. Moreover, the amount of exposure at the intermediate position among the three exposure positions is set at a proper value according to the distance d. Thus, the projection exposure method of the present invention employs a phase type or center blocking type pupil filter which is optimized on the assumption that it will be used in combination with a FLEX method in which three divided exposure operations are carried out for each shot region. Accordingly, the depth of focus and the margin of the exposure amount advantageously increase for isolated contact hole patterns, for example. The projection exposure method not only enables a satisfactory focal depth to be obtained for the transfer of isolated contact hole patterns but also provides high capability of separation (or high resolution) between a plurality of contact holes which are relatively close to each other. Moreover, the projection exposure method has the advantage that no undesired, erroneous transfer occurs between a plurality of contact hole patterns which are relatively far away from each other, that is, the ringing is advantageously small. Further, the focal depth obtained is not uniquely determined by the wavelength of exposure light or the numerical aperture of the projection optical system.

Accordingly, the distance in the optical axis direction between exposure positions at which divided exposure operations are successively carried out for each shot region according to the FLEX method, which is used in combination with the pupil filter, can be set at a desired value according to the required depth of focus. In addition, since the ratio of the amounts of exposure for the divided exposure operations is set according to the distance between the exposure positions in the optical axis direction, it is possible to realize exposure conditions under which the bottom diameter of a contact hole pattern transferred is constant with respect to the position in the optical axis direction for any value of the distance between the exposure positions. In other words, it is possible to obtain a sufficiently large focal depth.

It is another object of the present invention to provide a projection exposure method wherein the relationship between the above-described ratio r1/r2 and the amplitude transmittance t is set as given by the expression (1), which will be described later; the distance d in the optical axis direction is set at a value which is $\alpha(1<\alpha<2)$ times a standard distance U $(=(\lambda/[2\times\{1-(1-NA^2)^{1/2}\}])$; and the ratio of the amount of exposure at the intermediate exposure position to the amount of exposure at the other exposure positions is set at a value in a range determined by making allowances of ±5% for $(-2.14\alpha^2+7.37\alpha-5.15)$. The projection exposure method particularly enables the focal depth to increase and the ringing to decrease.

It is still another object of the present invention to provide a projection exposure apparatus for carrying out the above-described projection exposure methods.

To attain the above-described objects, the present invention provides a projection exposure method wherein a mask (R) formed with a pattern for transfer is illuminated with illuminating light (ILB) for exposure, and an image of the mask pattern is projected onto a photosensitive substrate (W) through a projection optical system (PL). A phase plate is disposed on a Fourier transform plane (FTP) of the projection optical system (PL) or on a plane near the Fourier transform plane. The phase plate includes a circular region of radius r2 which is centered at the optical axis of the projection optical system (PL) and which allows the illuminating light to pass therethrough. The circular region of radius r2 is divided into a central circular region (FA) of radius r1 (r1<r2) which is centered at the optical axis of the projection optical system (PL), and a peripheral annular region (FB) which lies between a circle of radius r1 and a circle of radius r2, which are centered at the optical axis. The ratio t (=t1/t2) of the amplitude transmittance t1 of illuminating light passing through the central circular region (FA) to the amplitude transmittance t2 of illuminating light passing through the peripheral annular region (FB) is set at a value which is not larger than zero, and the ratio r1/r2 of the radius r1 to the radius r2 is set at a value which is determined according to the amplitude transmittance ratio t.

Further, when the pattern image of the mask (R) is to be transferred onto the substrate (W) by successively carrying out three divided exposure operations such that the position of the substrate (W) relative to the position of the image-forming plane of the projection optical system (PL) changed in the optical axis direction by a distance d at a time, the distance d is set at a value which is determined according to the numerical aperture of the projection optical system (PL) and the wavelength of the illuminating light. Moreover, the amounts of exposure for two of the three divided exposure operations which are carried out at two opposite extremity positions of the exposure range in the optical axis direction are set substantially equal to each other, and the amount of exposure for one of the three divided exposure operations which is carried out at an intermediate position in the optical axis direction is set according to the distance d.

In a preferred embodiment, the ratio r1/r2 of the radius r1 to the radius r2 is set in a range determined by making allowances of ±15% for a value which is determined by an expression of (0.34+0.12t) using the amplitude transmittance ratio t. That is, it is preferable to satisfy the following condition:

$$0.85(0.34+0.12t) \leq r1/r2 \leq 1.15(0.34+0.12t) \quad (1)$$

Further, the distance d for the three divided exposure operations is preferably set in the range of from 1 to 2 times a standard distance U which is determined according to the following expression using the wavelength λ of illuminating light and the substrate-side numerical aperture NA of the projection optical system (PL):

$$U = \lambda/\{2[1-(1-NA^2)^{1/2}]\} \quad (2)$$

Assuming that the scale factor of the distance d with respect to the standard distance U is a distance factor α, (1<α<2) holds. Further, the ratio of the amount of exposure at the intermediate exposure position to the amount of exposure at one of the two extremity exposure positions is preferably set in a range determined by making allowances of ±5% for an optimal exposure ratio β1 which is determined by $$\beta1 = -2.14\alpha^2 + 7.37\alpha - 5.15 \quad (3)$$

It should be noted that the above expression (3) is the same as the expressions (4) and (8), which will be described later.

In addition, the present invention provides a projection exposure apparatus wherein a mask (R) formed with a pattern for transfer is illuminated with illuminating light for exposure, and an image of the mask pattern is projected on a photosensitive substrate (W) through a projection optical system (PL). The projection exposure apparatus has a phase plate (PF1) which is disposed on a Fourier transform plane (FTP) of the projection optical system (PL) or on a plane near the Fourier transform plane. The phase plate (FP1) has a circular region of radius r2 which is centered at the optical axis of the projection optical system (PL) and which allows the illuminating light to pass therethrough. The circular region of radius r2 is divided into a central circular region (FA) of radius r1 (r1<r2) which is centered at the optical axis of the projection optical system (PL), and a peripheral annular region (FB) which lies between a circle of radius r1 and a circle of radius r2, which are centered at the optical axis. The ratio t (=t1/t2) of the amplitude transmittance t1 of illuminating light passing through the central circular region (FA) to the amplitude transmittance t2 of illuminating light passing through the peripheral annular region (FB) is set at a value which is not larger than zero, and the ratio r1/r2 of the radius r1 to the radius r2 is set at a value which is determined according to the amplitude transmittance ratio t.

The projection exposure apparatus further has a relative height control mechanism (WST) for moving the substrate (W) and the image-forming plane of the projection optical system (PL) relative to each other in the optical axis direction, and an exposure control system (25, 26 and 3) for controlling the amount by which the substrate (W) is exposed to the illuminating light. When the pattern image of the mask (R) is to be transferred onto the substrate (W) by successively carrying out three divided exposure operations such that the position of the substrate (W) relative to the position of the image-forming plane of the projection optical system (PL) is changed in the optical axis direction by a distance d at a time through the relative height control mechanism, the distance d is set at a value which is determined at a value which is determined according to the numerical aperture of the projection optical system (PL) and the wavelength of the illuminating light. Moreover, the amounts of exposure for two of the three divided exposure operations which are carried out at two opposite extremity positions of the exposure range in the optical axis direction are set substantially equal to each other through the exposure control system, and the amount of exposure for one of the three divided exposure operations which is carried out at an intermediate position in the optical axis direction is set at a value which is determined according to the distance d through the exposure control system.

Figure 4:
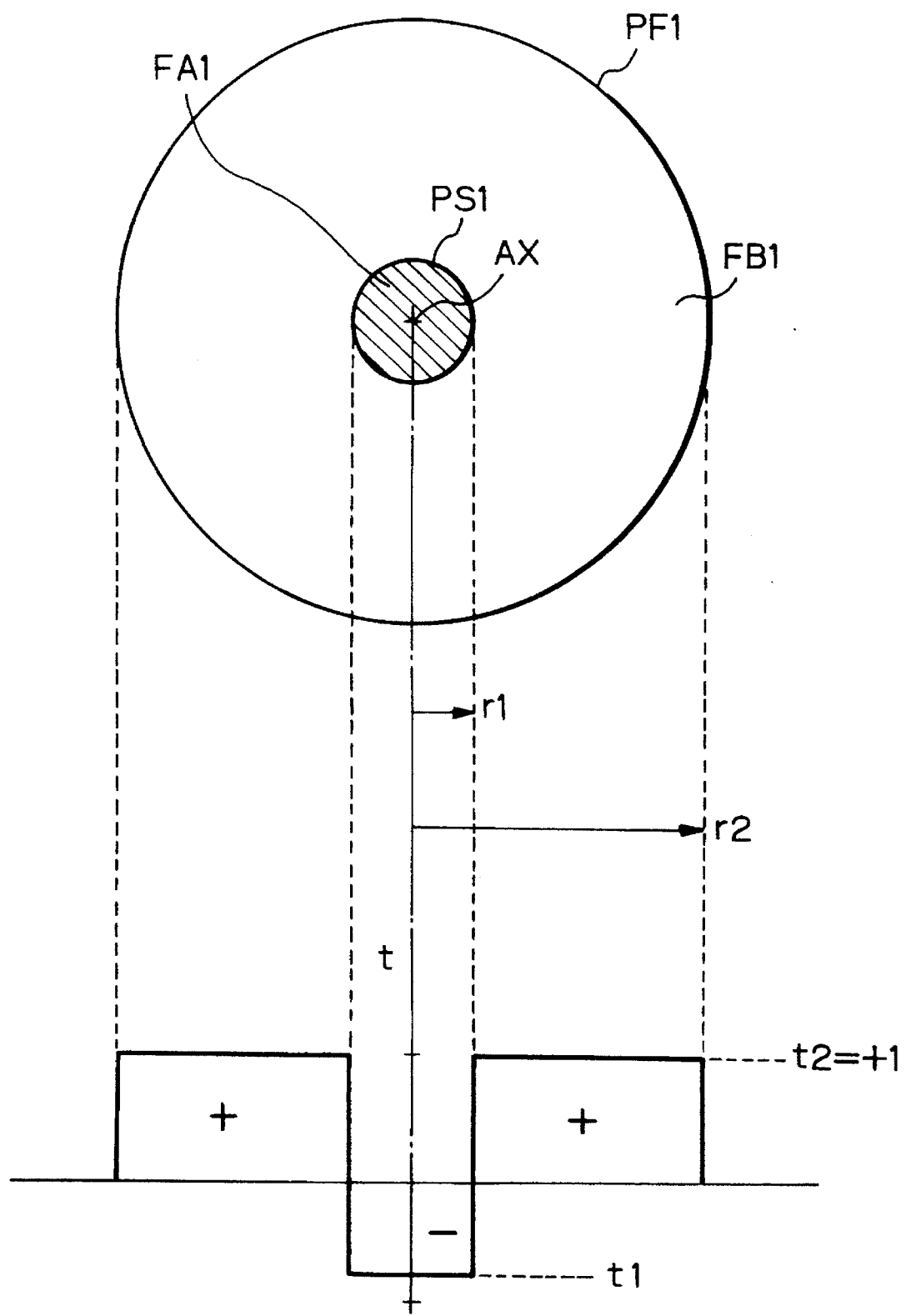
FIG. 4 shows the arrangement of a phase type pupil filter PF1 shown in FIG. 3.
Figure 5:
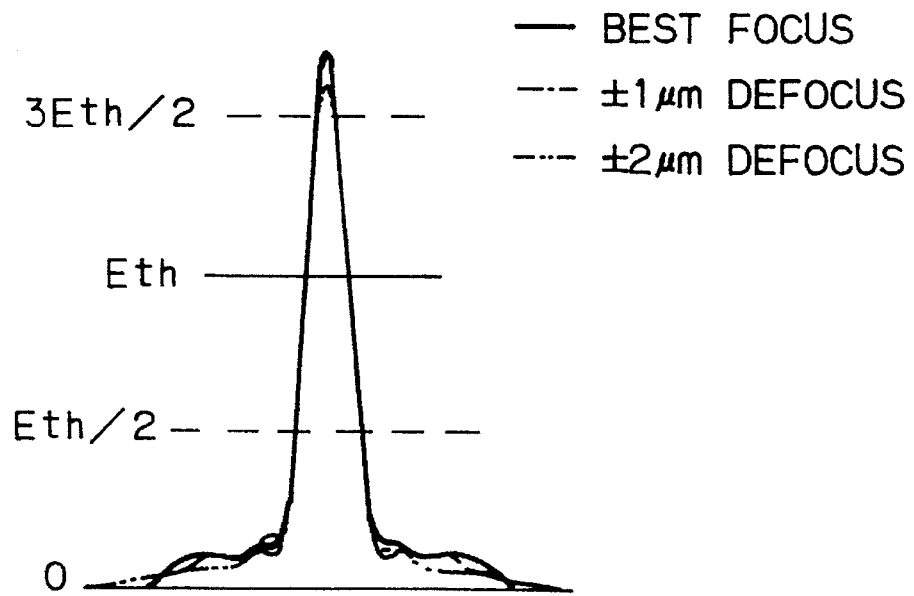
FIG. 5 is a graph showing results (cross-sectional intensity distribution) of simulation of an optical image of one contact hole pattern on a wafer in a case where the ratio (r1/r2) of the radius r1 of a circular transmitting region FA of the pupil filter PF1 shown in FIG. 4 to the radius r2 was 0.22, and the amplitude transmittance t1 was −1.0.
Figure 7:
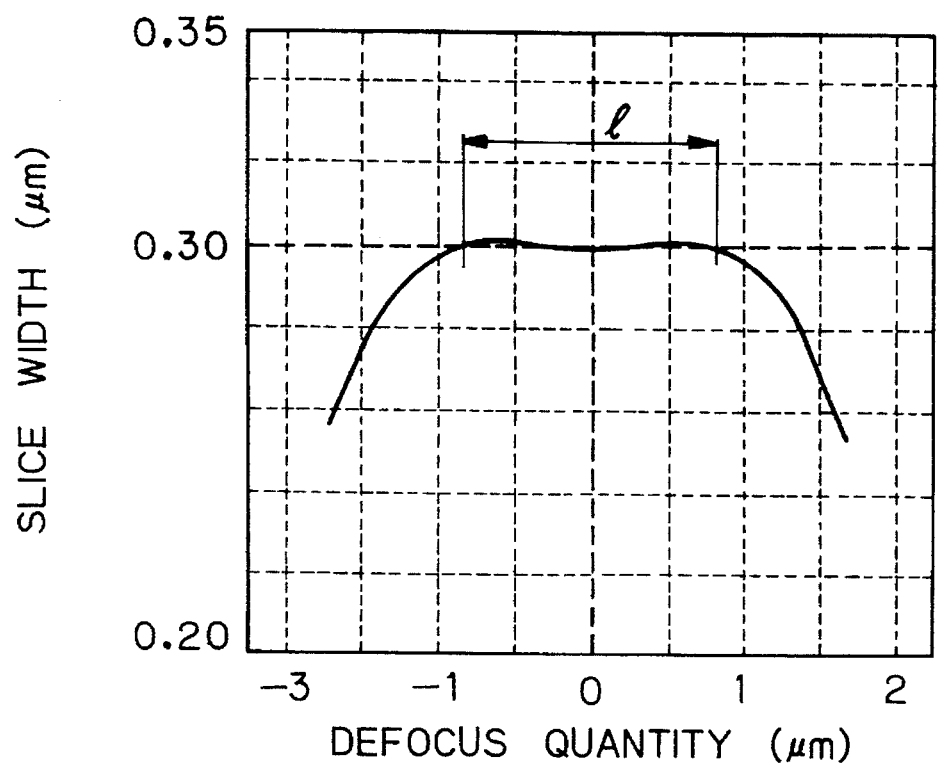
FIG. 7 is a graph showing the relationship between the slice width and the defocus quantity at the level Eth in a case where pattern transfer was carried out under the same conditions as in the case of FIG. 5 in terms of the ratio (r1/r2) of the radius r1 of the circular transmitting region FA of the pupil filter PF1 shown in FIG. 4 to the radius r2 and the amplitude transmittance t1 except that the distance between the exposure positions according to the FLEX method was changed.
Figure 9:
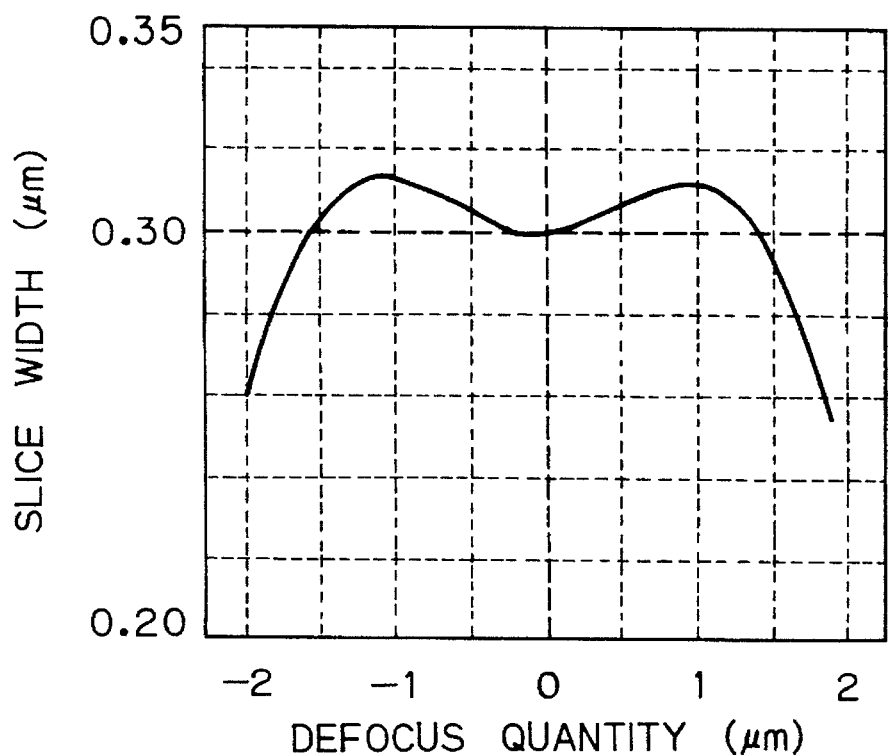
Figure 10:
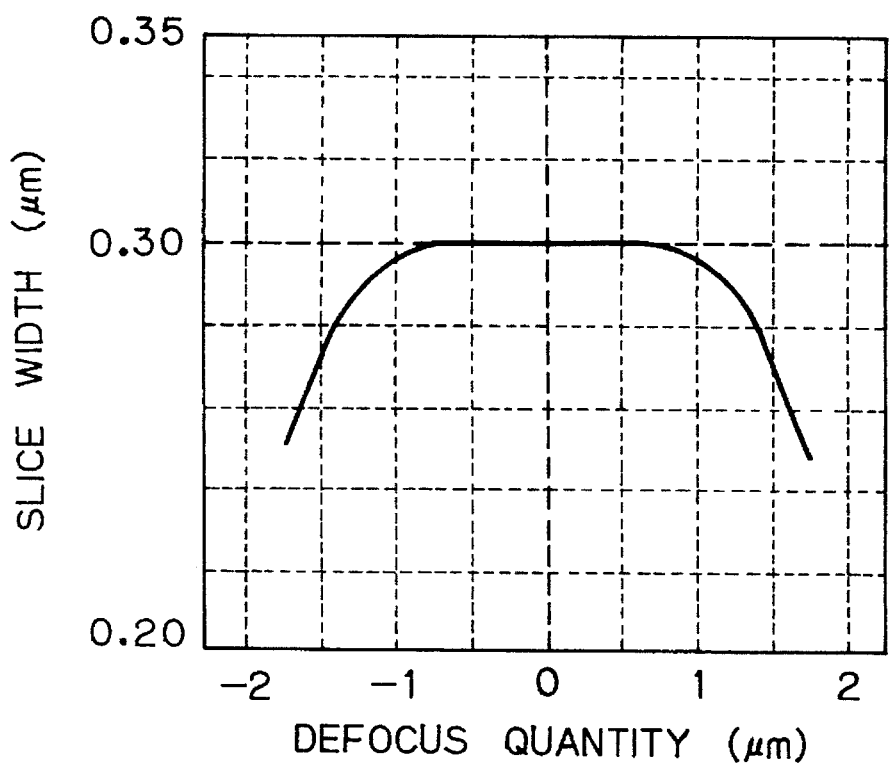
Figure 11:
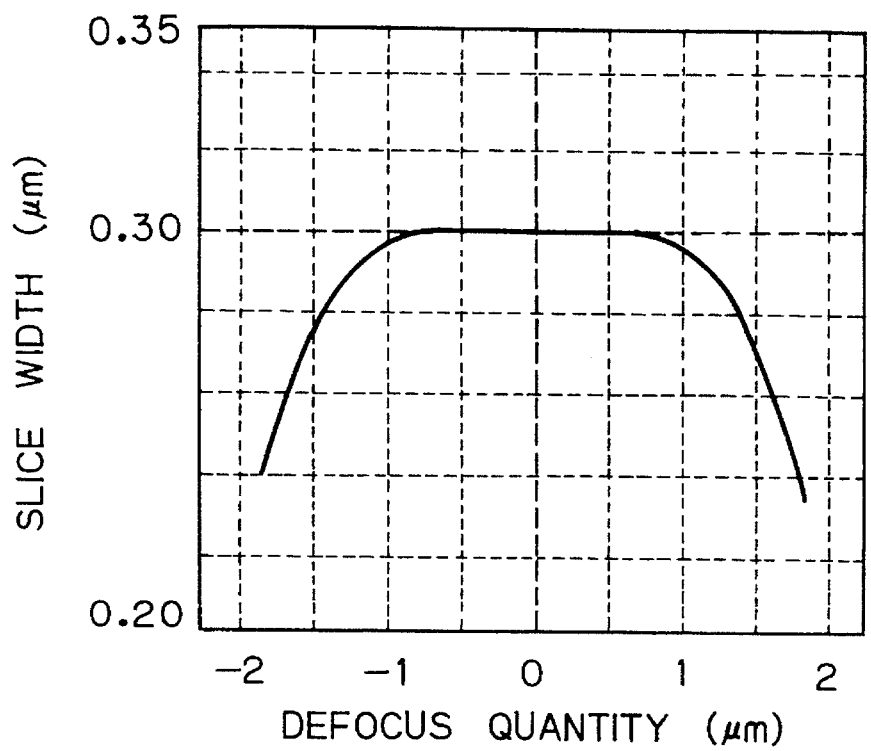
Figure 12:
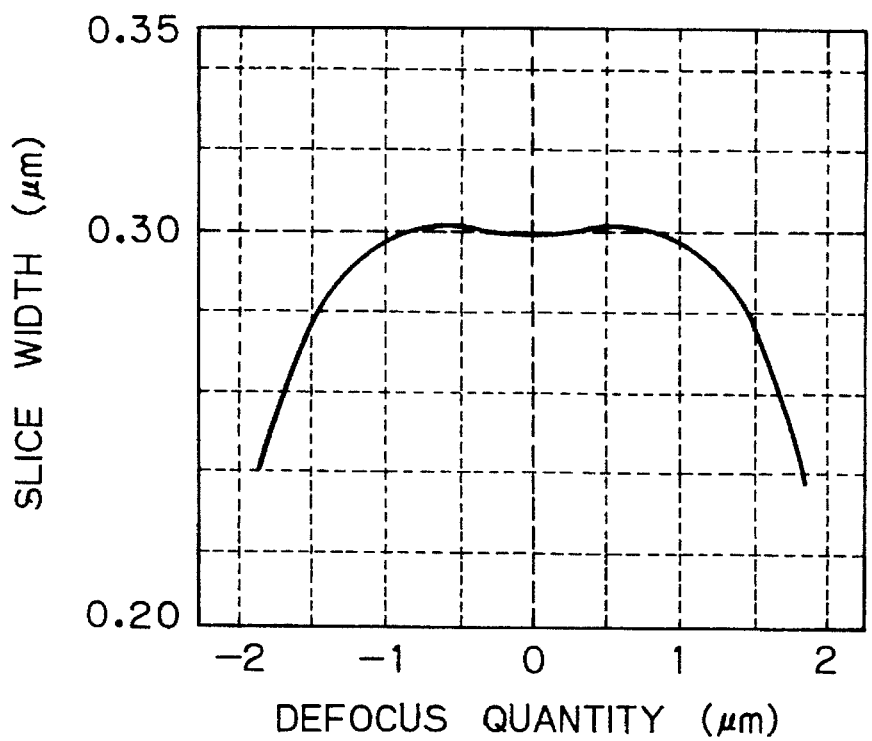
Figure 13A:
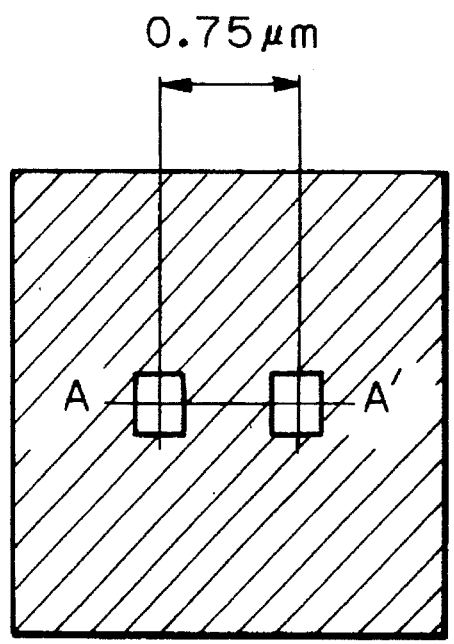
Figure 13B:
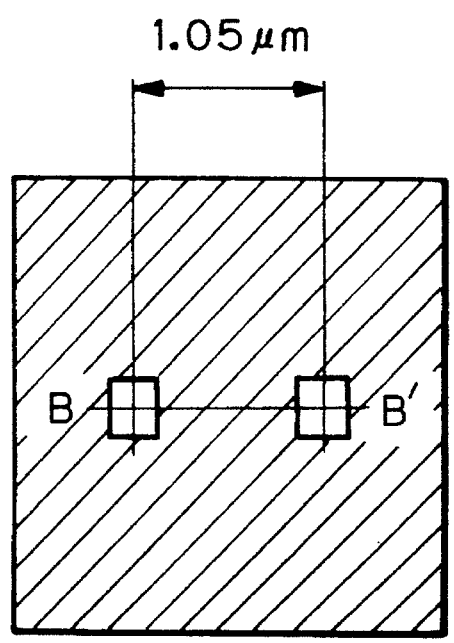
Figure 14A:
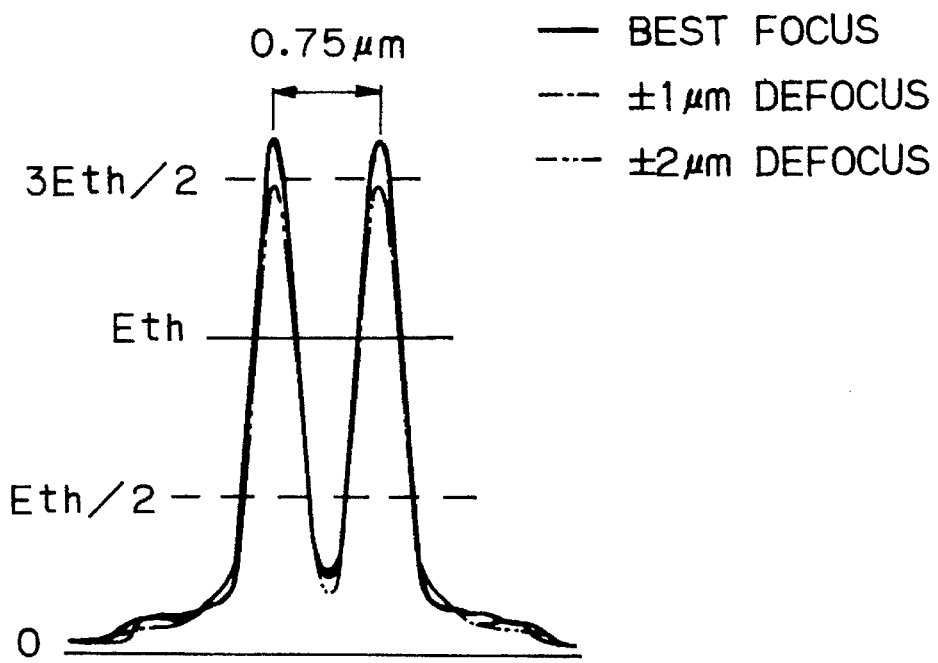
Figure 14B:
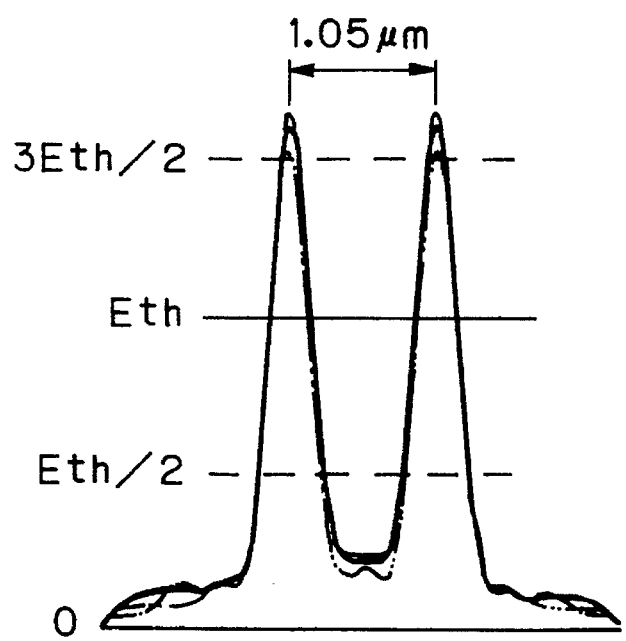
Figure 15A:
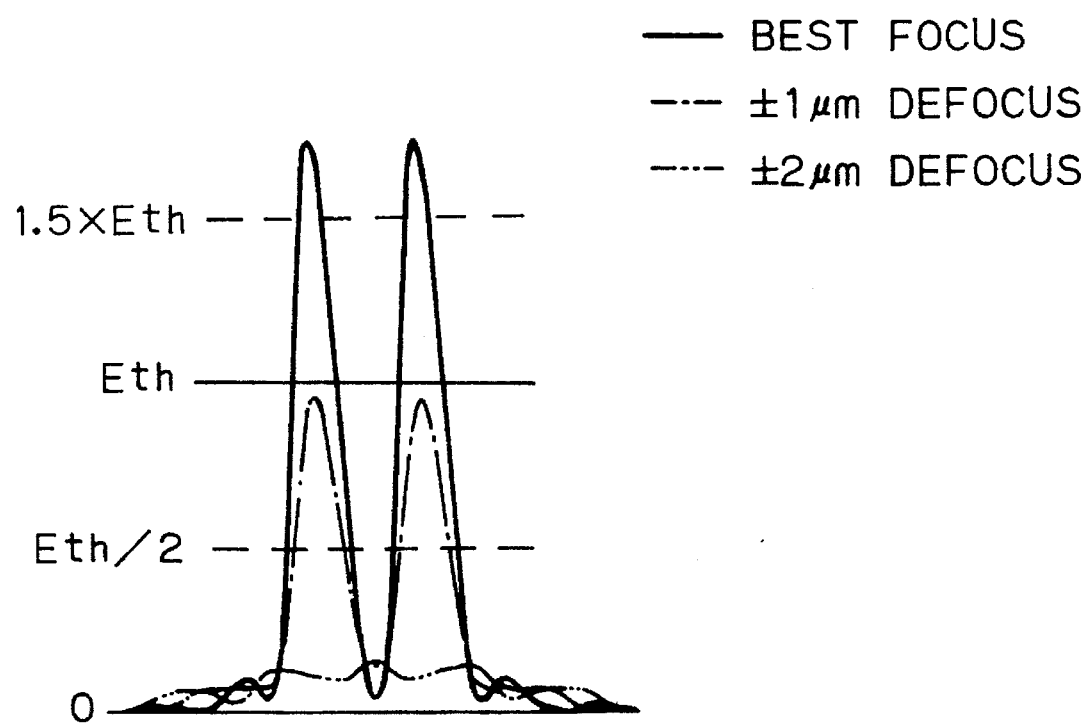
Figure 15B:
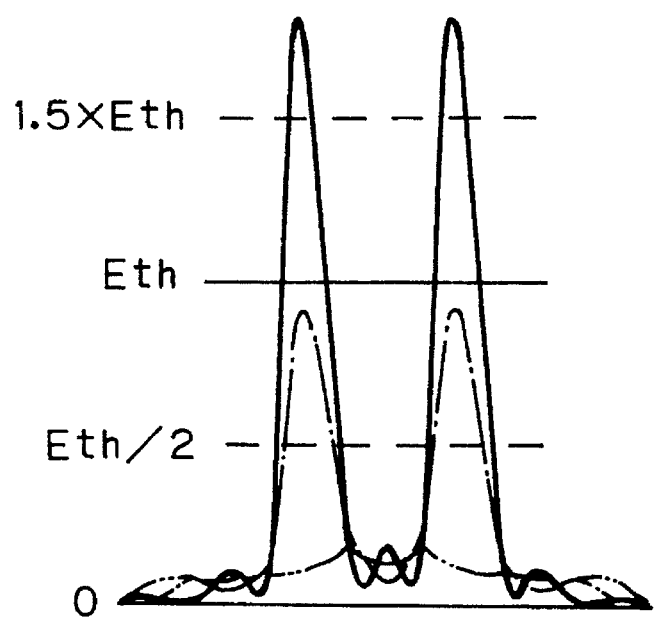
Figure 16A:
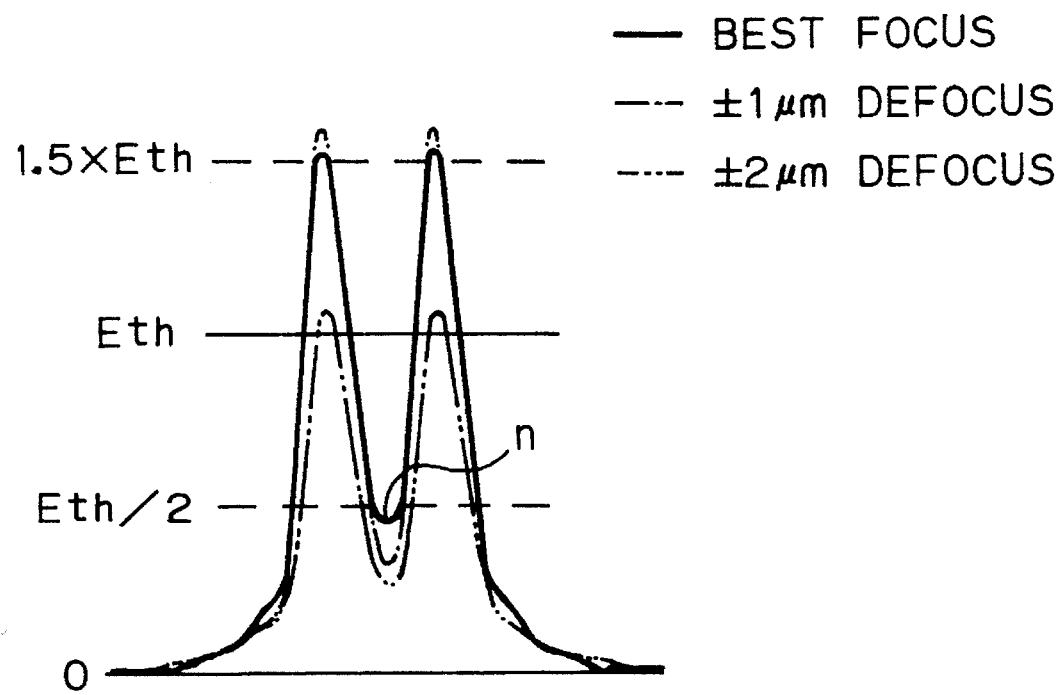
Figure 16B:
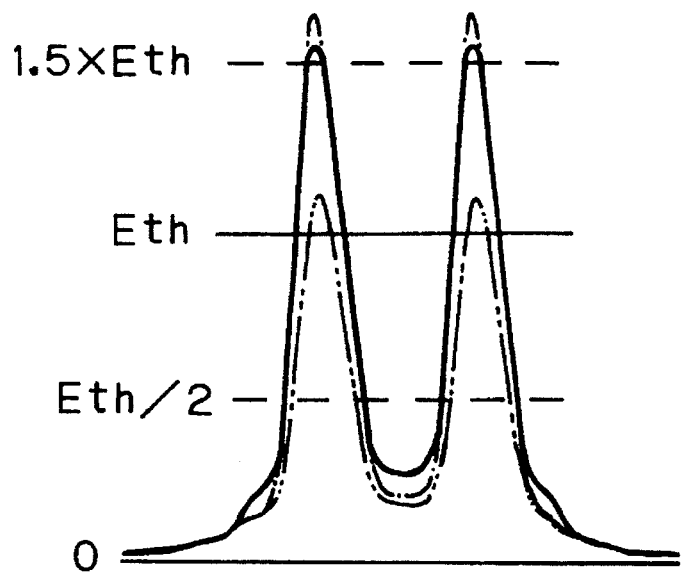
Figure 17A:
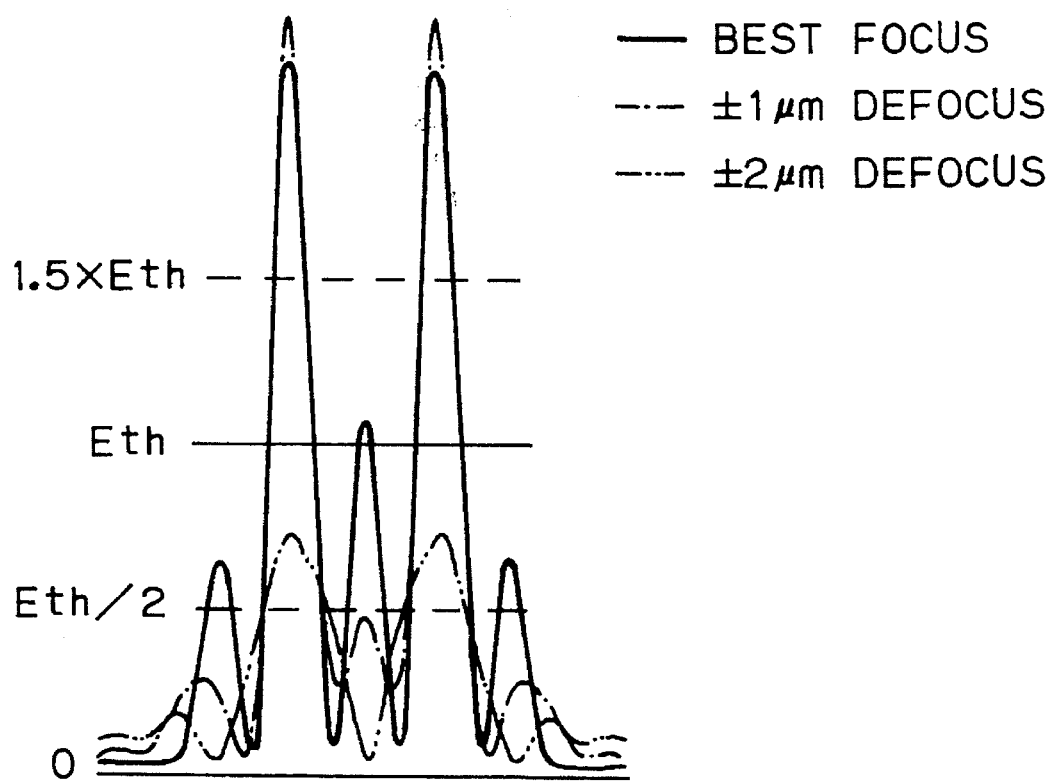
Figure 17B:
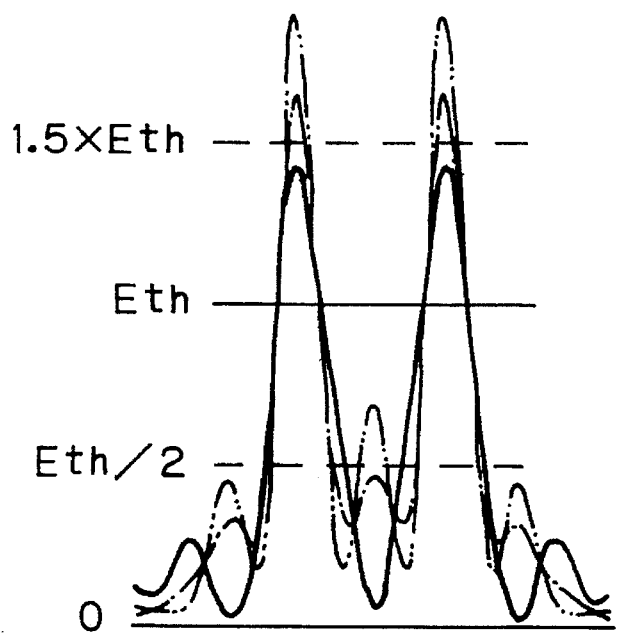

7 except that the distance between the exposure positions according to the FLEX method was changed;

FIG. 9 is a graph showing the relationship between the slice width and the defocus quantity at the level Eth based on the results of simulation in which pattern transfer was carried out by using a pupil filter similar to that shown in FIG. 4 in combination with a FLEX method in which the amounts of exposure for divided exposure operations were equal to each other;

FIG. 10 is a graph showing the relationship between the slice width and the defocus quantity at the level Eth based on the results of simulation in which pattern transfer was carried out under the conditions that the ratio (r1/r2) of the radius r1 of the circular transmitting region FA of the pupil filter PF1 shown in FIG. 4 to the radius r2 was 0.26, and the amplitude transmittance t1 was −0.6, and that the distance between the exposure positions according to the FLEX method was the same as in the case of FIG. 7;

FIG. 11 is a graph showing the relationship between the slice width and the defocus quantity at the level Eth based on the results of simulation in which pattern transfer was carried out under the conditions that the ratio (r1/r2) of the radius r1 of the circular transmitting region FA of the pupil filter PF1 shown in FIG. 4 to the radius r2 was 0.30, and the amplitude transmittance t1 was −0.33, and that the distance between the exposure positions according to the FLEX method was the same as in the case of FIG. 7;

FIG. 12 is a graph showing the relationship between the slice width and the defocus quantity at the level Eth based on the results of simulation in which pattern transfer was carried out under the conditions that the ratio (r1/r2) of the radius r1 of the circular transmitting region FA of the pupil filter PF1 shown in FIG. 4 to the radius r2 was 0.34, and the amplitude transmittance t1 was 0, and that the distance between the exposure positions according to the FLEX method was the same as in the case of FIG. 7;

FIG. 13(A) shows two contact hole patterns which are 0.75 μm away from each other in terms of measurement on the wafer;

FIG. 13(B) shows two contact hole patterns which are 1.05 μm away from each other in terms of measurement on the wafer;

FIG. 14(A) is a graph showing results (cross-sectional intensity distribution) of simulation of an optical image on a wafer in a case where the contact hole patterns shown in FIG. 13(A) were transferred onto the wafer under the same exposure conditions as in the case of FIG. 5;

FIG. 14(B) is a graph showing results (cross-sectional intensity distribution) of simulation of an optical image on a wafer in a case where the contact hole patterns shown in FIG. 13(B) were transferred onto the wafer under the same exposure conditions as in the case of FIG. 5;

FIG. 15(A) is a graph showing results (cross-sectional intensity distribution) of simulation of an optical image on a wafer in a case where the contact hole patterns shown in FIG. 13(A) were transferred onto the wafer by a conventional ordinary exposure method;

FIG. 15(B) is a graph showing results (cross-sectional intensity distribution) of simulation of an optical image on a wafer in a case where the contact hole patterns shown in FIG. 13(B) were transferred onto the wafer by a conventional ordinary exposure method;

FIG. 16(A) is a graph showing results (cross-sectional intensity distribution) of simulation of an optical image on a wafer in a case where the contact hole patterns shown in FIG. 13(A) were transferred onto the wafer by jointly using a conventional ordinary exposure method and a FLEX method;

FIG. 16(B) is a graph showing results (cross-sectional intensity distribution) of simulation of an optical image on a wafer in a case where the contact hole patterns shown in FIG. 13(B) were transferred onto the wafer by jointly using a conventional ordinary exposure method and a FLEX method;

FIG. 17(A) is a graph showing results (cross-sectional intensity distribution) of simulation of an optical image on a wafer in a case where the contact hole patterns shown in FIG. 13(B) were transferred onto the wafer by using only a conventional double focus type pupil filter (phase shift type pupil filter) under the same optical conditions (NA, λ, and σ) as in the case of FIG. 5; and FIG. 17(B) is a graph showing results (cross-sectional intensity distribution) of simulation of an optical image on a wafer in a case where the contact hole patterns shown in FIG. 13(B) were transferred onto the wafer by jointly using a conventional double focus type pupil filter (phase shift type pupil filter) and a FLEX method under the same optical conditions (NA, λ, and σ) as in the case of FIG. 5.

DESCRIPTION OF THE PREFERRED EMBODIMENTS

One embodiment of the present invention will be described below with reference to the accompanying drawings.

Figure 1:
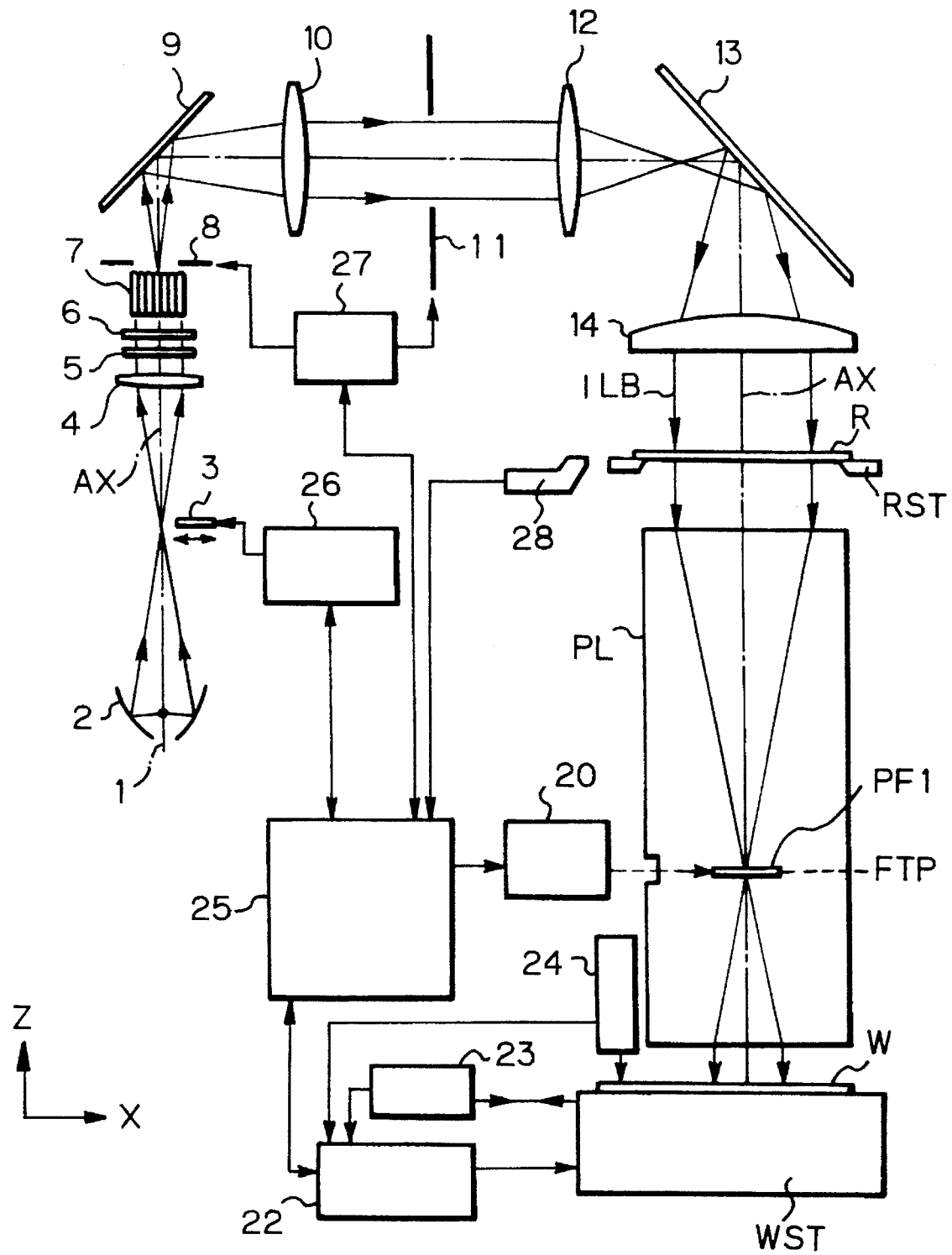
FIG. 1 shows the arrangement of a projection exposure apparatus according to one embodiment of the present invention.

FIG. 1 shows the general arrangement of a stepper-type projection exposure apparatus according to one embodiment of the present invention. Referring to FIG. 1, illuminating light ILB emitted from a mercury-vapor lamp 1 is converged on the secondary focal point of an elliptical mirror 2 by the elliptical mirror 2. Thereafter, the illuminating light ILB is incident on a collimator lens 4 in the form of divergent light. A rotary shutter 3 is disposed at a secondary focal point of the elliptical mirror 2 (which is a front focal point of the collimator lens 4) to control an exposure operation such that illuminating light ILB is selectively passed and cut off. Illuminating light ILB converted into an approximately parallel beam of light by the collimator lens 4 is successively incident on a short-wavelength cut filter 5 and an interference filter 6, where only a desired spectral line required for exposure, e.g., the i-line, is extracted. The illuminating light ILB (i-line) emanating from the interference filter 6 then enters a fly-eye lens 7 which serves as an optical integrator. It should be noted that the illuminating light ILB that is selected by the interference filter 6 is not limited to the i-line, and that a wavelength other than the i-line or a plurality of wavelengths may be used. As a light source for exposure, it is possible to use an excimer laser light source, a metal vapor laser or YAG laser harmonic generator, etc. in addition to the mercury-vapor lamp 1.

The illuminating light ILB (approximately parallel light beam) incident on the fly-eye lens 7 is divided by a plurality of lens elements constituting the fly-eye lens 7, so that a secondary light source image (i.e., an image of a light-emitting point of the mercury-vapor lamp 1) is formed on the exit side of each lens element by the divided illuminating light ILB. Accordingly, point light source images, the number of which is the same as the number of lens elements, are distributed to form a surface light source image on the exit side of the fly-eye lens 7. A variable stop 8 is provided on the exit side of the fly-eye lens 7 to control the size of the surface light source image. The illuminating light ILB (divergent light) passing through the stop 8 is reflected by a mirror 9 so as to pass through a first relay lens system 10, a reticle blind 11, and a second relay lens system 12. After being reflected by a mirror 13, the illuminating light ILB enters a condenser lens 14 to irradiate a reticle R with a uniform illuminance distribution.

In FIG. 1, among a plurality of illuminating light beams from a plurality of secondary light source images (point light sources) formed on the exit side of the fly-eye lens 7, only the illuminating light from one secondary light source image lying on an optical axis AX is shown as a typical illuminating light beam. The exit side of the fly-eye lens 7 (i.e., the surface where the secondary light source images are formed) forms a Fourier transform plane with respect to the pattern surface of the reticle R. Accordingly, illuminating light beams ILB which are emitted from a plurality of secondary light source images formed by the fly-eye lens 7 and which are incident on the relay lens system 10 are superimposed on one another on the reticle R in the form of parallel light beams which are slightly different in incident angle from each other.

Accordingly, the range ψ of incident angles of the illuminating light beam ILB to the reticle R varies according to the aperture diameter of the variable stop 8. That is, as the practical area of the surface light source is reduced by reducing the aperture diameter of the variable stop 8, the incident angle range ψ, also decreases. Thus, the variable stop 8 serves to control the spatial coherency of the illuminating light. As a factor that represents the degree of spatial coherency of the illuminating light, the ratio (σ value) of the sine of the maximum incident angle ψ/2 of the illuminating light beam ILB to the reticle-side numerical aperture NAr of the projection optical system PL is employed. In general, the σ value is defined as $\sigma=\sin(\psi/2)/NAr$. Many steppers which are presently in operation are used in the σ range of about 0.5 to about 0.7. In this embodiment, σ may assume any value; in an extreme case, it may be in the range of about 0.1 to about 0.3. If necessary, a modified light source stop (a stop which has a plurality of apertures decentered with respect to the optical axis) according to the above-described SHRINC method or an annular stop may be used.

It should be noted that the reticle blind 11 is in imagery relation to the reticle R. Thus, the illuminating area on the reticle R can be limited by the aperture configuration of the reticle blind 11.

Incidentally, the pattern surface of the reticle R has a predetermined reticle pattern formed from a chromium layer or the like in general. Let us assume that the reticle R in this embodiment has a chromium layer deposited on the whole pattern surface thereof and formed with a plurality of contact hole patterns defined by fine rectangular openings (i.e., transparent portions where no chromium layer is present). A contact hole pattern may be designed so that when projected on a wafer W, the contact hole pattern has a size of not larger than 0.5 by 0.5 μm square (or a diameter of not larger than 0.5 μm). The size of contact hole patterns as measured on the reticle R is determined by taking into consideration the projection magnification M of the projection optical system PL. Generally, when the distance between a pair of adjacent contact hole patterns is considerably greater than the opening size of one contact hole pattern, these contact hole patterns are far away from each other, that is, they exit as being isolated fine patterns. That is, in many cases, each pair of adjacent contact hole patterns are sufficiently apart from each other to such an extent that beams of light (diffracted light or scattered light) produced from these contact hole patterns will not strongly affect each other as in the case of diffraction gratings. However, there are some reticles which have contact hole patterns formed relatively close to each other contrary to the above. With such reticles, light beams produced from the contact hole patterns affect each other [see FIGS. 13(A) and 13(B)] as in the case of diffraction gratings; therefore, care is necessary.

Referring to FIG. 1, the reticle R is retained on a reticle stage RST, and an optical image (light intensity distribution) of the contact hole patterns on the reticle R is formed on a photoresist layer provided on the surface of the wafer W through the projection optical system PL. In FIG. 1, an optical path from the reticle R to the wafer W is shown by only the chief ray in the bundle of image-forming light rays. A phase type (or light-blocking type) pupil filter PF1, PF2, or PF3 (see FIG. 3) is provided on a Fourier transform plane (hereinafter referred to as "pupil plane") FTP in the projection optical system PL. It should be noted that FIG. 1 shows the arrangement of the apparatus in a case where the pupil filter PF1 is disposed on the Fourier transform plane FTP.

In a case where the projection exposure apparatus of this embodiment is provided with only one pupil filter, if the apparatus is used for exposure of only contact hole patterns including no L&S pattern, the pupil filter may be fixed in the projection optical system PL. However, in a case where an exposure operation for a lithography process is carried out by using a plurality of projection exposure apparatuses, it is not efficient to assign a specific projection exposure apparatus to exposure for contact hole patterns from the viewpoint of achieving the most efficient use of each apparatus. Therefore, it is preferable to provide the pupil filter such that it can be selectively inserted into and removed from the pupil plane (Fourier transform plane) of the projection optical system PL, thereby enabling the projection exposure apparatus to be also used for exposure of a reticle pattern (e.g., L&S pattern) other than contact hole patterns. In this embodiment, therefore, a plurality of pupil filters PF1 to PF3 are provided so that these pupil filters can be selectively inserted into and removed from the optical path.

The pupil filters PF1 to PF3 each have a diameter which is sufficiently large to cover the maximum diameter (corresponding to the numerical aperture NA) of the pupil plane of the projection optical system PL, and are secured to a retaining member (e.g., a turret plate, a slider, etc.) which is moved by an exchanging mechanism 20 so that a pupil filter selected from among the three pupil filters PF1 to PF3 can extend into and withdraw from the optical path. It should be noted that in some projection optical systems a circular aperture stop (NA varying stop) may be provided at the pupil position (Fourier transform plane FTP) in order to vary effective pupil diameter. In this case, the NA varying stop and the pupil filters PF1 to PF3 are disposed so as not to mechanically interfere with each other and yet lie as close to each other as possible. As shown in FIG. 1, a Z-axis is taken in a direction which is parallel to the optical axis AX, and an X-axis is taken in a direction which is parallel to the plane of FIG. 1 and perpendicular to the Z-axis. Further, a Y-axis is taken in a direction which is perpendicular to the plane of FIG. 1.

The wafer W is retained on a wafer stage WST which is adapted to move two dimensionally in a plane perpendicular to the optical axis AX (this movement will hereinafter be referred to as "XY movement") and also move slightly in a direction (direction Z) parallel to the optical axis AX (this movement will hereinafter be referred to as "Z movement"). The XY movement and Z movement (Z movement in an ordinary focusing operation and in the FLEX method) of the wafer stage WST are effected by a stage driving unit 22. The XY movement is controlled according to a coordinate value measured by a laser interferometer 23, whereas the Z movement is controlled according to a value detected by a focus sensor 24 used for autofocusing. One example of the autofocus sensor 24 is disclosed in U.S. Pat. No. 4,650,983. The stage driving unit 22, the exchanging mechanism 20, etc. operate on the basis of a command issued from a main control unit 25. The main control unit 25 also sends a command to a shutter driving unit 26 to control the opening and closing operation of the rotary shutter 3 and further sends a command to an aperture control unit 27 to control the aperture size (or opening degree) of the variable stop 8 or the reticle blind 11. It should be noted that the Z movement may be effected by the projection optical system PL in place of the wafer stage WST. More specifically, to move the image-forming plane of the projection optical system PL in the direction of the optical axis AX, it is preferable to employ an arrangement such as that disclosed, for example, in U.S. Pat. No. 4,871,237. That is, the space that is defined between two adjacent optical elements constituting the projection optical system PL is hermetically sealed, and the pressure in the space is controlled so as to move the image-forming plane of the projection optical system PL in the optical axis direction. Alternatively, it is preferable to move at least one optical element constituting the projection optical system PL in the direction of the optical axis AX, or to move the reticle R in the optical axis direction, as disclosed in U.S. Pat. No. 5,117,255.

In this embodiment, exposure is carried out by performing three (for example) divided exposure operations at different positions spaced in the direction Z according to the FLEX method (i.e., an exposure method in which multiple exposure is carried out by moving the position of the wafer relative to the image-forming plane of the projection optical system PL in the direction of the optical AX), disclosed in U.S. Pat. No. 4,869,999, and the moving distance by which the relative position is moved in the direction Z can be set at any desired value. Information concerning the moving distance is also input to the main control unit 25 through a console or the like (not shown). The main control unit 25 determines a set position of the wafer stage WST according to the inputted value of the moving distance in the direction Z, and transmits information concerning the determined set position to the stage driving unit 22. Further, the main control unit 25 obtains a ratio $\beta 1$ of the amount of exposure at an intermediate exposure position to the amount of exposure (assumed to be 1) at each extremity exposure position of the exposure range in the direction Z, in which three divided exposure operations are carried out by the FLEX method, according to the following relationship in this embodiment, which will be described later in detail. Then, the main control unit 25 calculates a shutter speed (i.e. the length of time that the shutter is open) for each of the three divided exposure operations on the basis of the exposure ratio $\beta 1$ and a total exposure time which is also input through the console or the like (not shown), and transmits a shutter control signal based on the shutter speed to the shutter driving unit 26. The exposure ratio $\beta 1$ is obtained according to the following expression (4) (which is the same as the above-described expression (3) and the expression (9) described later):

$$\beta 1 = -2.14\alpha^2 + 7.37\alpha - 5.15 \quad (4)$$

where $\alpha$ is a distance factor as will be described for the expression (8).

Conversely, the exposure ratio (the above-described exposure ratio $\beta 1$) of the three divided exposure operations may be input through the console or the like to obtain the above-described distance factor $\alpha$ according to the expression (4). To effect even more strict exposure control, an amount of exposure may be detected with an exposure monitor (illuminometer; not shown) which is provided in the illumination optical system, and fed back to calculate the above-described shutter speed. Regarding the total exposure time, which is input through the console or the like, it may be input in the form of exposure energy (illuminance× exposure time) in place of time. In a case where continuous light, e.g., emission lines from a mercury-vapor lamp, is used as exposure light, the amount of exposure is controlled by using a shutter, as described above. However, when pulsed light, e.g. laser light from an excimer laser, is used as exposure light, no shutter is needed, and the amount of exposure should be controlled by on/off controlling an emission trigger pulse which is to be sent to the laser light source. In this case, the exposure control is effected by controlling at least either the amount of energy per pulse or the number of pulses oscillated (see U.S. Pat. No. 5,097,291).

Further, the main control unit 25 is capable of inputting a reticle name read by a bar code reader 28 which is provided in the path for transporting a reticle to the reticle stage RST. Accordingly, the main control unit 25 generally controls the operation of the exchanging mechanism 20 and the operation of the aperture control unit 27 according to an inputted reticle name, thereby making it possible to automatically control the aperture sizes of the variable stop 8 and the reticle blind 11 and whether or not the pupil filter is required (and also selection of the most suitable pupil filter) in conformity to the reticle used. Further, the distance factor $\alpha$ and the exposure ratio $\beta 1$ for the three divided exposure operations may be automatically determined according to the reticle name read by the bar code reader 28.

Figure 2:
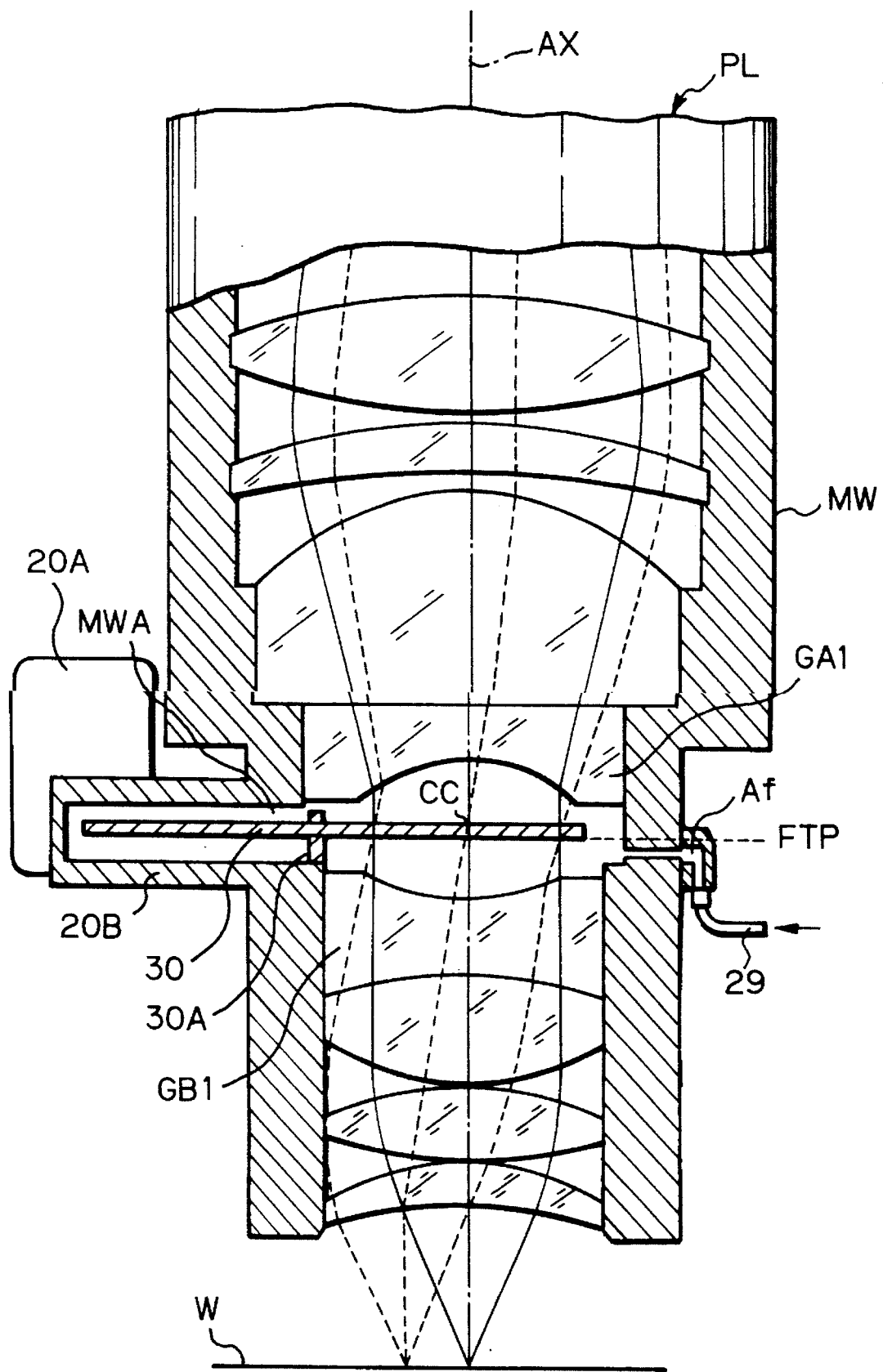
FIG. 2 is an enlarged sectional view showing a part of a projection optical system shown in FIG. 1.

The structure of a part of the projection optical system PL shown in FIG. 1 will be explained below with reference to FIG. 2. FIG. 2 is a fragmentary enlarged sectional view showing a part of the projection optical system PL that is made of a refractive glassy material in its entirety. The Fourier transform plane (pupil plane) FTP is present in the space defined between the lowermost lens GA1 of a front lens system and the uppermost lens GB1 of a rear lens system. The projection optical system PL has a plurality of lenses retained by a lens barrel MW. In this embodiment, an opening MWA is provided in a part of the lens barrel MW to exchange a plurality of pupil filters PF by rotating the retaining member 30 in parallel to the XY-plane. Further, a cover 20B extends from the opening MWA of the lens barrel MW so as to prevent the retaining member 30, which retains the pupil filters PF1 to PF3, and a rotational driving shaft 30A from being entirely or partly exposed directly to the outside air. The cover 20B prevents minute dust floating in the outside air from entering the pupil space in the projection optical system PL.

In addition, the exchanging mechanism 20 (see FIG. 1) is provided with an actuator 20A, e.g., a rotating motor, so that the pupil filters PF1 to PF3 can be alternately positioned on the pupil plane FTP of the projection optical system PL by the rotation of the retaining member 30. Further, a flow path Af is provided in a part of the lens barrel MW so as to communicate with the pupil space. Thus, temperature-controlled clean air is supplied to the pupil space through a pipe 29 and the flow path Af, thereby suppressing not only the rise in temperature of the pupil filter PF caused by absorption of exposure light but also the rise in temperature of the whole pupil space. It should be noted that if the clean air forcibly supplied to the pupil space is forcibly discharged through the exchanging mechanism 20 and the actuator 20A, it is possible to prevent dust generated from the exchanging mechanism 20, the retaining member 30, etc. from entering the pupil space.

Figure 3:
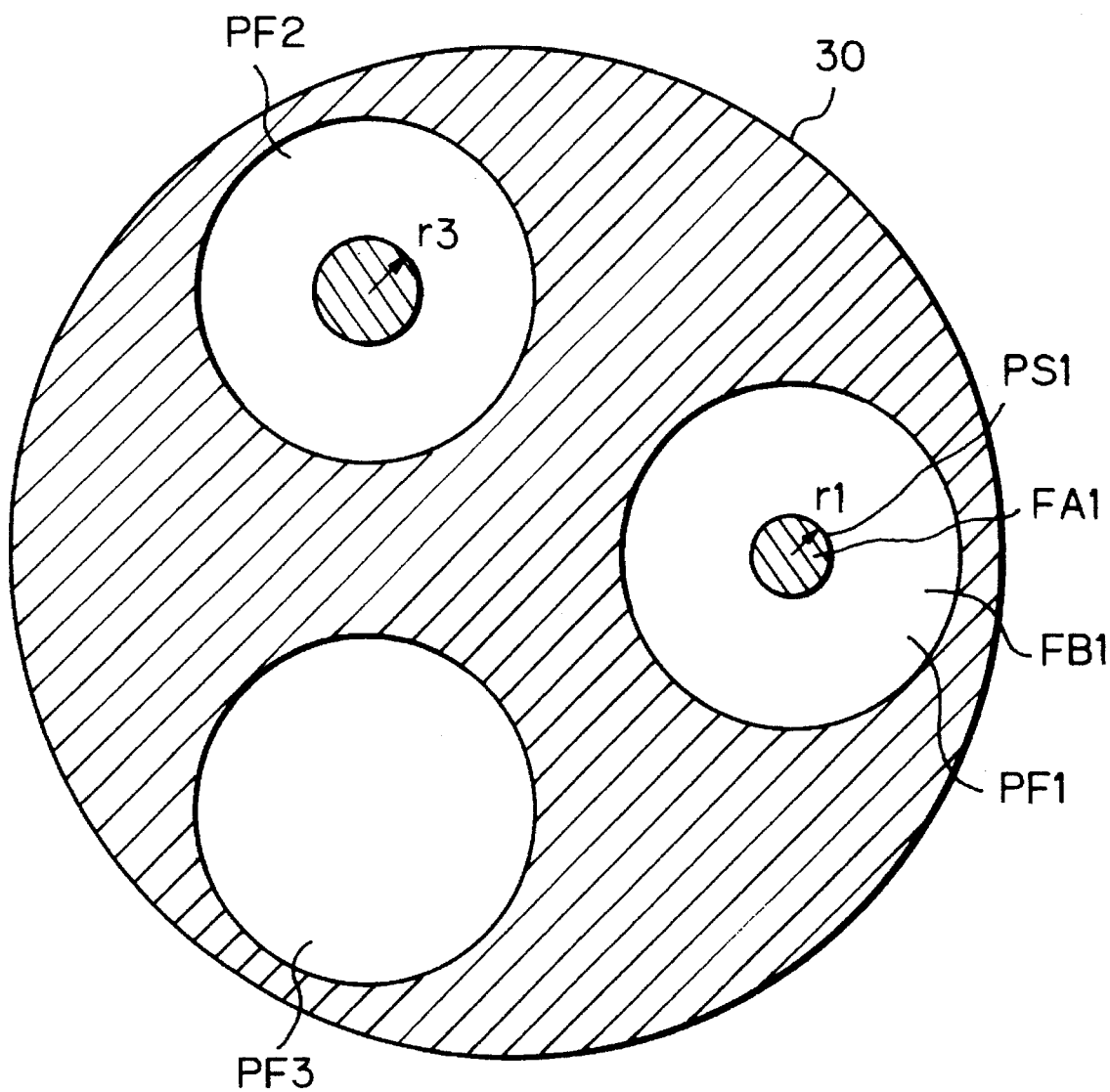
FIG. 3 is an enlarged plan view showing specific arrangements of pupil filters mounted on a retaining member 30 shown in FIG. 2.

FIG. 3 shows specific arrangements of the pupil filters PF1 to PF3 mounted on the retaining member 30 in FIG. 2. The three pupil filters PF1 to PF3 are secured to a turret-shaped disk at equal angular spacings. The three pupil filters PF1 to PF3 each have a radius which is sufficiently large to cover the maximum radius of the pupil plane of the projection optical system PL. Accordingly, image-forming light distributed in the pupil plane FTP always passes through one of the pupil filters PF1 to PF3 independently of the aperture diameter of the NA varying stop described above. The pupil filter PF3 is particularly used for exposure of L&S patterns. Therefore, it is disposed on the pupil plane FTP when ordinary exposure (including the SHRINC method and the annular illumination method), which employs no phase shifter, is to be carried out. The pupil filter PF3 is a transparent plane-parallel plate (e.g., a quartz substrate) having a thickness (optical thickness) approximately equal to that of the pupil filters PF1 and PF2. The pupil filter PF3 is used to minimize variation of the image-forming characteristics (aberrations) of the projection optical system PL.

The pupil filters PF1 and PF2 are phase type pupil filters, which are formed by depositing phase shifters PS1 and PS2 [e.g., spin-on-glass (SOG)] having a predetermined thickness in respective central circular regions (hatched portions in FIG. 3) of transparent substrates made, for example, of quartz. Accordingly, in the pupil filters PF1 and PF2, the amplitude of light passing through central circular transmitting regions FA1 and FA2 (phase shift portions), that is, the transmittance t1 of the circular transmitting regions, is different from the amplitude of light passing through peripheral substrate naked regions FB1 and FB2 around the circular transmitting regions FA1 and FA2, that is, the transmittance t2 of the substrate naked regions. The thickness of the phase shifters PS1 and PS2 is adjusted so that a phase difference of $(2m+1)\pi$ [rad] (where m is an integer) is given between light transmitting through the central circular transmitting regions FA1 and FA2 and light passing through the substrate naked regions FB1 and FB2.

Assuming that the amplitude transmittance of the central region FA of each of the pupil filters PF1 and PF2 is t1, and the amplitude transmittance of the peripheral region FB is t2, a pupil filter in which the amplitude transmittance ratio t (=t1/t2) is 0 is equivalent to "light-blocking type pupil filter", which may also be produced by cutting a light-blocking member (thin plate), e.g., a metal plate, such that a peripheral portion that is to serve as a light-transmitting portion is removed, with a central circular region left as it is. When such a "light-blocking type" pupil filter is used for contact hole patterns, the above-described pupil filter PF3, which is used for ordinary exposure, may be a plate which merely has an opening.

Incidentally, in this embodiment, the pupil filters PF1 and PF2 are made different from each other in the radius of the central region FA and also in the amplitude transmittance of the central region FA. That is, the central regions FA1 and FA3 of the pupil filters PF1 and PF2 have different radii r1 and r3 and different amplitude transmittances t1 and t2. The reason for this is that in the pupil filter according to this embodiment, at least either of optimal values for the radius of the central region FA and the amplitude transmittance ratio t (=t1/t2) of the amplitude transmittance t1 of the central region FA to the amplitude transmittance t2 of the peripheral region FB changes according to the numerical aperture (pupil plane diameter) of the projection optical system PL. (It should be noted that in this embodiment the amplitude transmittance ratio t is equivalent to the amplitude transmittance t1 of the central region because the ratio t is determined by depositing a phase shifter on the central region). Accordingly, two pupil filters which are different in forming conditions from each other are prepared in order to allow an optimal pupil filter to be used for each of two values of the numerical aperture NA in a projection exposure apparatus in which the numerical aperture NA of the projection optical system PL can be varied by an NA varying stop as described above. However, the present invention is not necessarily limited to the described arrangement. That is, the structure of the retaining member 30 may be modified so that three or more different types of pupil filter are provided, thereby enabling optimization of the radius of the central region and the amplitude transmittance for each of three or more different numerical apertures NA, i.e., allowing an optimal pupil filter to be used for each numerical aperture NA.

FIG. 4 is an enlarged plan view showing the arrangement of the phase type pupil filter PF1. It is assumed that the pupil filter PF1 has been loaded in the projection optical system PL with the center thereof made coincident with the optical axis AX. Referring to FIG. 4, the pupil filter PF1 has a circular phase shifter PS of radius r1 which is centered at the optical axis AX. Let us assume that the region that is occupied by the phase shifter PS is a central region FA1, and the remaining region on the pupil filter PF1, which lies outwardly of the central region FA1, is a peripheral region FB1. The phase shifter PS is arranged such that, when the amplitude of light passing through the peripheral region FB1 is +1.0 (reference), the phase of light passing through the central region FA1 is inverted by the phase shifter PS, and the absolute value of the amplitude thereof becomes t1 smaller than 1.0 (i.e., a real number which satisfies the condition of $-1 \leq t1 \leq 0$). Further, the phase shifter PS causes extinction of the light to a certain extent. The extinction of the light can be obtained, for example, by forming the phase shifter PS itself from a light-absorbing material. However, the phase shifter PS may be formed from a double-layer film, for example, which is composed of a thin metallic film (having a predetermined transmittance to allow a part of light to pass therethrough) and a light-transmitting phase shifter. It should be noted that in FIG. 4 the outer radius r2 of the pupil filter PF1 is equal to the maximum numerical aperture (i.e., the maximum radius of the pupil plane) of the projection optical system PL. However, the outer radius r2 of the pupil filter PF1 may be larger than the maximum radius of the pupil plane in practice because in a region having a diameter larger than the outer radius r2 the image-forming light is blocked by the above-described NA varying stop, which is provided in the projection optical system PL. In addition, the pupil filter PF itself can be used as an aperture stop (NA stop) by making the outer radius r2 of the pupil filter PF smaller than the maximum radius of the pupil plane of the projection optical system.

This embodiment intends to minimize ringings while ensuring a satisfactory focal depth and exposure margin by jointly using the above-described phase type pupil filter and a conventional FLEX method. Therefore, in this embodiment the wafer stage WST for retaining the wafer W, as shown in FIG. 1, performs the function of a conventional FLEX method. That is, the wafer stage WST serves to move wafer W in the direction of the optical axis AX during the intervals between the three divided exposure operations.

As a result of extensive simulation made by the present inventor, the following has been found: Assuming that the ratio of the amplitude transmittance t1 of the central region FA1 to the amplitude transmittance t2 of the peripheral region FB1 is t (=t1/t2), the radius r1 of the central region FA1 and the outer radius r2 of the pupil filter PF1 shown in FIG. 4 should satisfy the relationship shown by the following expression (5) using the above-described ratio t (t1/t2):

$$r1=(0.84+0.12t) \times r2 \tag{5}$$

This is the optimal solution for minimizing ringings while ensuring a satisfactory focal depth and exposure margin using the pupil filter PF1. It should be noted that in the above expression, the outer radius r2 is the radius of the aperture stop (NA varying stop), provided at the pupil plane FTP as described above; alternatively, the outer radius r2 is the radius of the pupil plane in the case of a projection optical system having no aperture stop provided at the pupil plane. Since the amplitude transmittance t2 of the peripheral region FB1 is a fixed value (t2=1), the radius r1 and the amplitude transmittance t1 should be controlled so as to satisfy the above relationship. It should be noted that when t in the above expression is 0 (t=0), that is, t1=0, the pupil filter is a light-blocking type filter in which only the central region (which is centered at the optical axis) is shielded from light.

In a case where the numerical aperture of the projection optical system PL is varied by the NA varying stop provided at the Fourier transform plane FTP, the value of the pupil plane radius r2 in the above relationship changes. Therefore, the pupil filter PF must be changed to a pupil filter in which at least either of the radius r1 and the amplitude transmittance t1 has been changed so as to conform to the numerical aperture varied. In actual practice, however, the radius r1 is not necessarily limited to (0.34+0.12t)r2, which is defined by the above expression. Practically, satisfactory performance can be obtained as long as the radius r1 is in a range determined by making allowances of about ±15% for the value defined by the above expression (i.e., in the range of from 0.85r1 to 1.15r1). That is, in the pupil filter PF1 shown in FIG. 4 the radius r1 and the amplitude transmittance t1 may be determined so as to satisfy the following relationship:

$$0.85 \times (0.34+0.12t) \times r2 \leq r1 \leq 1.15 \times (0.34+0.12t) \times r2 \tag{6}$$

Accordingly, the pupil filter PF1 can be used without a need of change as long as the amount of change of the numerical aperture of the projection optical system PL caused by the NA varying stop, which is provided at the Fourier transform plane FTP, is in the range of about ±15%.

Further, it is assumed that the wavelength of the illuminating light ILB (exposure light) is λ, and the wafer-side numerical aperture of the projection optical system PL is NA, and that the distance in the optical axis direction between each pair of adjacent positions for divided exposure which is successively carried out three times in total for each shot region according to the FLEX method (i.e., the amount of movement in the direction Z per exposure operation for the wafer W) is d. Here, a predetermined standard distance U which is given by the following expression (7) is introduced:

$$U=\lambda/[2 \times \{1-(1-NA^2)^{1/2}\}] \tag{7}$$

where λ is the wavelength of exposure light, and NA is the wafer-side numerical aperture of the projection optical system PL.

The distance d is divided by the standard distance U to obtain a distance factor α. With the distance factor α introduced, the distance d is set so that the distance factor α falls within the following range:

$$1<\alpha<2, \text{ that is, } 1<d/U<2 \tag{8}$$

Assuming that the amount of exposure at each extremity exposure position of the exposure range in the optical axis direction, in which three divided exposure operations are successively carried out, is 1 (reference exposure quantity), an optimal exposure ratio β1 for the intermediate exposure position in the optical axis direction (i.e., the ratio of the amount of exposure at the intermediate exposure position to the amount of exposure at each extremity exposure position) can be obtained by substituting the value of the distance factor α, obtained as described above, into the following equation (9). It should be noted that the amounts of exposure at the two opposite extremity exposure positions in the optical axis direction need not be precisely equal to each other but may vary from each other within the range of about ±5%, for example. When there is such variation in the amount of exposure, an average value of the amounts of exposure at the two extremity exposure positions may be used as a reference exposure quantity.

$$\beta 1=-2.14\alpha^2+7.37\alpha-5.15 \tag{9}$$

This is also the optimal value obtained by simulation made by the present inventor under conditions which minimize ringings while ensuring a satisfactory focal depth and exposure margin.

It should be noted that an allowable proper exposure ratio β need not be strictly coincident with the value of the above-described optimal exposure ratio β1, and that practically sufficient performance can be obtained as long as the exposure ratio β is in a range determined by making allowances of about ±5% for the value of β1. That is, the range of proper exposure ratio β at the above-described intermediate exposure position is as follows:

$$0.95\beta 1 \leq \beta \leq 1.05\beta 1 \tag{10}$$

Incidentally, for the movement of the wafer W, the movement of the wafer stage WST may be controlled on the basis of a value measured by a position measuring device, e.g., an encoder, which may be provided on a wafer moving mechanism inside the wafer stage WST. Alternatively, the wafer stage WST may be controlled on the basis of a value detected by the focus sensor 24 or the like in the arrangement shown in FIG. 1. It is also possible to move the reticle R in place of the wafer W during exposure. In this case, however, the amount of movement must be increased by an amount corresponding to the longitudinal magnification (the square of the lateral magnification) of the projection optical system PL. That is, if the projection optical system PL is a 5×system (i.e., 1/5 reduction system), for example, the amount of movement of the reticle R is 25 times the amount of movement of the wafer W. It should be noted that the image-forming plane of the projection optical system PL may be shifted along the optical axis by moving at least a part of optical elements constituting the projection optical system PL or slightly changing the wavelength of the illuminating light ILB applied to the reticle R. In this case, the amount of shift of the image-forming plane is determined to be approximately equal to the amount of movement of the wafer W, described above.

Next, the effect of this embodiment will be explained on the basis of the results of simulation in which the phase type pupil filter PF1 in this embodiment (FIG. 4) and a FLEX method were used in combination.

FIG. 5 shows results of simulation (cross-sectional intensity distribution) of an optical image of only one contact hole pattern which was 0.3 by 0.3 μm square on the wafer when the amplitude transmittance t1 of the circular transmitting region (central region FA1) in FIG. 4 was set at −1 (where t2=+1.0), and the radius r1 was set at 0.22×r2 according to the expression (5). The exposure conditions were as follows: the wavelength of the illuminating light ILB was 0.365 μm of the i-line; the numerical aperture NA of the projection optical system PL (at the wafer side) was 0.57; and the σ value of the illuminating optical system was 0.6. In addition, the FLEX method in which a divided exposure operation was carried out at each of three discrete positions spaced in the optical axis direction (direction Z) was used in combination with the pupil filter PF1, and the distance d in the direction Z between each pair of adjacent positions for the divided exposure was 2.0 μm.

The distance factor α (d/U), which is the ratio of the distance d (=2.0 μm) to the standard distance U (U=λ/[2×{1−(1−NA$^2$)$^{1/2}$}] determined by the exposure wavelength (wavelength of the illuminating light ILB) λ and the wafer-side numerical aperture NA of the projection optical system PL according to the above-expression (7), is given by $$\alpha 2.0/(0.365/(2\times(1-(1-0.57^2)^{1/2}))=1.95 \quad (11)$$

Accordingly, if the value of α is substituted into the expression (9), the optimal exposure ratio β1=1.08 is obtained. That is, with respect to the distance d in the direction Z according to the FLEX method in this case, the optimal amount of exposure at the intermediate exposure position in the three divided exposure operations is defined as being 1.08 times the amount of exposure at each extremity exposure position of the exposure range.

The results of simulation shown in FIG. 5 were obtained by the exposure quantity distribution based on the results of the above-described calculation. That is, in the simulation, three optical images obtained with the best focus position shifted by 2.0 μm were added together (intensity synthesis) after being weighted according to the exposure ratio. It should be noted that the level Eth in FIG. 5 represents the amount of exposure required to completely expose a positive photoresist to the exposure light (so that the exposed photoresist is completely removed after development). That is, the slice width of the optical image at the level Eth corresponds to the bottom diameter of a contact hole pattern appearing in the photoresist after the development. In FIG. 5, the solid line represents an optical image of one contact hole pattern on the wafer W at the best focus position, the dot-dash line represents an optical image of the contact hole pattern at a±1 μm defocus position, and the two-dot and dash line represents an optical image of the contact hole pattern at a±2 μm defocus position. In this embodiment, there is substantially no change between the three contact hole pattern images because the focal depth at each focus position is extremely deep. It should be noted that the gain of the optical images was set so that the slice width at the level Eth at the best focus position was 0.3 μm (design value).

It should be noted that the slice width (which corresponds to the bottom diameter of a contact hole pattern of the resist image) at the level Eth is a quantity which changes according to the change of the optical image caused by defocusing.

Figure 6:
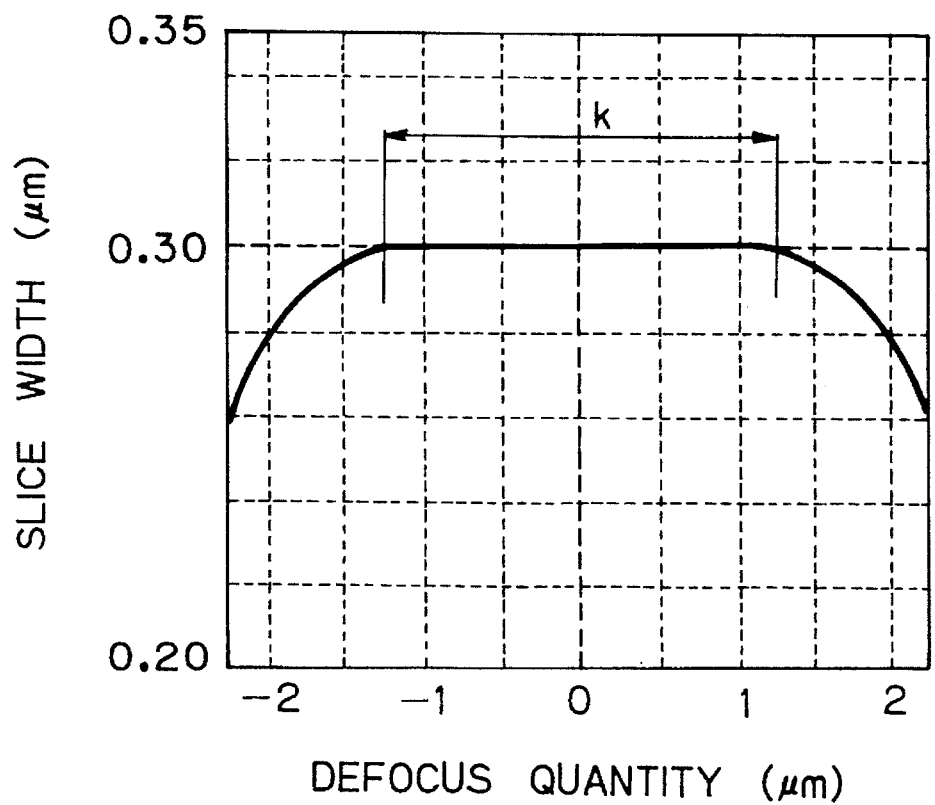
FIG. 6 is a graph showing the relationship between the slice width and the defocus quantity at the level Eth based on the results of the simulation shown in FIG. 5.

FIG. 6 shows the relationship between the defocus quantity and the slice width of the optical image at the level Eth based on the experiment shown in FIG. 5. In this embodiment, since the change of the optical image caused by defocusing is extremely small, there is almost no change in the slice width at the level Eth within the defocus range of about ±1.25 μm. Accordingly, if exposure is actually carried out under such conditions, it is possible to obtain a focal depth of about 2.5 μm (which is determined by the displacement of the contact hole bottom diameter from the design value), as shown by the distance range k in FIG. 6. Incidentally, since the focal depth that is required for actual exposure transfer of a semiconductor integrated circuit is about 1.6 μm, if pattern transfer is carried out under the above-described conditions (particularly with the distance between the exposure positions according to the FLEX method), a focal depth which is larger than necessary is obtained.

On the other hand, the gain of the optical image that is required to obtain a slice width of 0.3 μm at the level Eth is 20.3 (i.e., 20.3 times the amount of exposure required to completely expose a positive photoresist on the wafer to the exposure light by using a complete plain glass reticle). Accordingly, under the above-described conditions, it is likely that the exposure time will increase, and the throughput (processing capacity) will reduce, undesirably.

FIG. 7 also shows the relationship between the slice width and the defocus quantity at the level Eth in this embodiment. The exposure conditions in this case were as follows: the distance in the direction Z between each pair of adjacent positions for the divided exposure according to the FLEX method was set at 1.7 μm, and the optimal exposure ratio (β1) was determined according to the set distance as follows:

$$\alpha=1.7/(0.365/(2\times(1-(1-0.57^2)^{1/2}))=1.66 \; \beta 1=-2.14\alpha^2+7.37\alpha-5.15=1.18$$

The other conditions were the same as those in the case of FIGS. 5 and 6. In the simulation shown in FIG. 7 also, the exposure ratio for the divided exposure operations was optimized according to the moving distance in the direction Z for divided exposure according to the FLEX method. Therefore, a slice width at a constant level Eth was obtained over a defocus range of about ±0.8 μm, as shown by the distance range l in FIG. 7. Accordingly, a necessary and sufficient focal depth l of about 1.6 μm is obtained. Moreover, the gain of the optical image is 17.2. In other words, the amount of exposure required is smaller than in the case of FIG. 6, and the throughput also increases.

Figure 8:
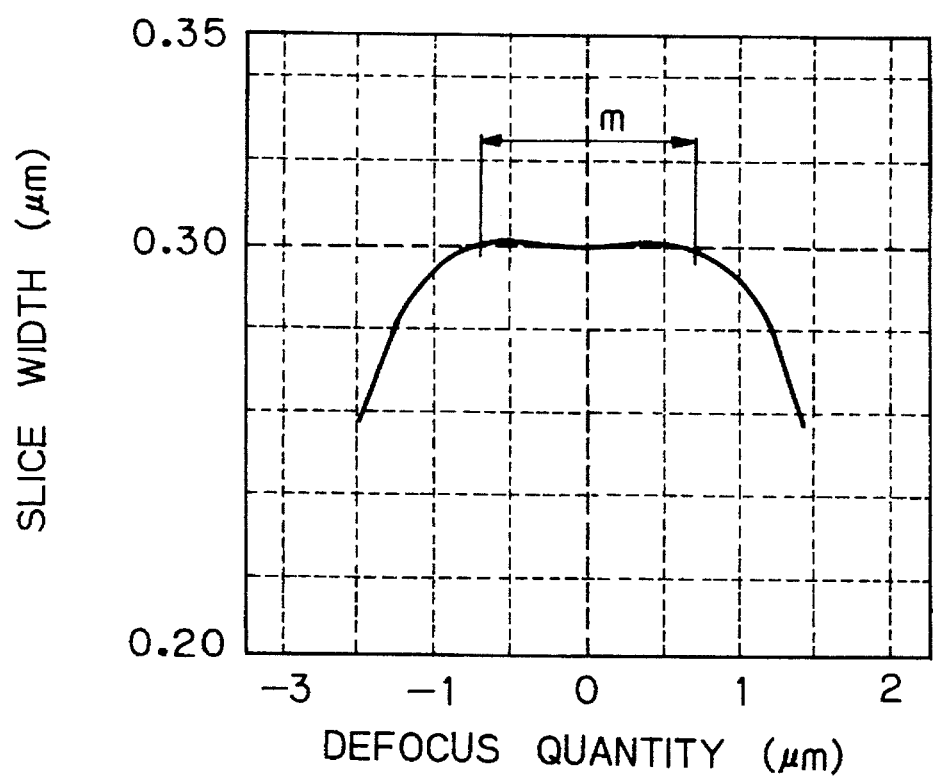
FIG. 8 is a graph showing the relationship between the slice width and the defocus quantity at the level Eth based on the results of simulation in which pattern transfer was carried out under the same conditions as in the case of FIG.

FIG. 8 shows the relationship between the slice width and the defocus quantity at the level Eth in a case where the moving distance in the direction Z for divided exposure according to the FLEX method was further reduced to 1.2 μm. The optimal exposure ratio (β1) was determined to be β1=0.55 according to the above expression (9). The other conditions were the same as those in the case of FIGS. 5, 6 and 7. As shown in FIG. 8, a slice width at a constant level Eth was obtained over a defocus range of about ±0.7 μm, as shown by the distance range m. Thus, a focal depth of about 1.4 μm is obtained. Since the gain of the optical image is 14.9, the amount of exposure required further decreases, and the throughput increases to a considerable extent. The focal depth of about 1.4 μm is somewhat small for the actual exposure transfer of a semiconductor integrated circuit. However, it is a sufficiently practicable value for an exposure step in the first half of the process for producing a semiconductor integrated circuit or the like (i.e., for an exposure step at which very large steps have not yet been formed on the wafer). Thus, according to this embodiment, the moving distance in the direction Z for divided exposure according to the FLEX method can be varied according to each individual exposure process (i.e., according to the focal depth necessary for the process).

FIG. 9 shows the relationship between the slice width and the defocus quantity at the level Eth in a case where a phase type pupil filter similar to that used in the above-described examples was used in combination with a FLEX method in which the amounts of exposure for divided exposure operations were equal to each other, and where the distance in the direction Z between each pair of adjacent positions for the divided exposure operations was set at 1.7 μm. According to this simulation, the slice width at the level Eth becomes considerably larger than the design value (=0.3 μm) in the vicinity of a 1.0 μm defocus position. That is, the change of the contact hole bottom diameter caused by defocusing is unfavorably large. Accordingly, it is difficult to use this method for the actual exposure transfer of a semiconductor integrated circuit.

The above examples use a pupil filter in which the radius r1 of the circular transmitting region (central region FA1), which is shown in FIG. 4, is set at r1=0.22×r2, and the amplitude transmittance t1 at t1=−1.0 (where t2=+1.0). However, the pupil filter used in the present invention is not necessarily limited to these conditions. Any pupil filter that satisfies the condition (6) provides advantageous effects approximately the same as those described above.

FIGS. 10, 11 and 12 show the relationship between the slice width and the defocus quantity at the level Eth for different pupil filters in which the amplitude transmittance ratio t and the radius ratio r (r1/r2) in the above expression (5) were (−0.66 and 0.026), (−0.33 and 0.30), and (0 and 0.34), respectively. The distance in the direction Z between each pair of adjacent positions (three positions in total) for divided exposure according to the FLEX method was set at 1.7 μm, and the optimal exposure ratio β1 was set at 1.18 in the same way as in the case of FIG. 7. It will be understood from these figures that any pupil filter that is formed under these conditions provides a focal depth of about 1.6 μm in the same way as in the case of FIG. 7. Even when the moving distance in the direction Z for divided exposure according to the FLEX method is set at a value other than 1.7 μm, as long as the value of the optimal exposure ratio β1 is determined according to the conditional expression in this embodiment, it is possible to obtain favorable image-forming characteristics in which there is no change in the slice width at the level Eth due to defocusing in the same way as in the case of FIGS. 6 and 8.

Incidentally, contact hole patterns which are to be transferred include not only isolated patterns such as those described above but also patterns in which a plurality of contact hole patterns are arranged relatively close to each other. FIG. 14(A) shows a cross-sectional image intensity distribution along the line A—A' of an image of a pattern in which, as shown in FIG. 13(A), two contact holes which are 0.3 by 0.3 μm square (in terms of measurement on the wafer) are arranged relatively close to each other, i.e., at a distance between two centers of 0.75 μm (in terms of measurement on the wafer). FIG. 14(B) shows a cross-sectional image intensity distribution along the line B—B' of an image of a pattern in which, as shown in FIG. 13(B), two contact holes which are 0.30 by 0.30 μm square (in terms of measurement on the wafer) are arranged relatively far away from each other, i.e., at a distance between two centers of 1.05 μm (in terms of measurement on the wafer). Conditions in these simulations are the same as those in the case of FIG. 5.

As shown in FIGS. 14(A) and 14(B), the exposure method of this embodiment enables a large focal depth to be obtained even for contact hole patterns which are relatively close to each other (FIG. 14(A)) or contact hole patterns which are relatively far away from each other (FIG. 14(B)), and further has an advantage in that no unwanted transfer (bright peak) occurs between the two contact holes. It should be noted that advantageous effects which are almost similar to those described above can also be obtained by using another pupil filter formed under the conditions according to this embodiment, and employing another moving distance for the FLEX method which is determined according to this embodiment.

FIGS. 15(A) and 15(B) show the results (optical images) of simulation in which no FLEX method was employed in a conventional ordinary exposure process (using no pupil filter) for comparative purposes. FIG. 15(A) shows optical images of the patterns shown in FIG. 13(A), and FIG. 15(B) shows optical images of the patterns shown in FIG. 13(B). In FIGS. 15(A) and 15(B), since the phase type pupil filter of the present invention and a FLEX method were not used in combination, the image (dot-dash line) at the ±1 μm defocus position is degraded to a considerable extent in comparison to the image (solid line) at the best focus position. Therefore, it will be understood that no satisfactory focal depth can be obtained with the ordinary image-forming method.

FIGS. 16(A) and 16(B) also show the results of simulation in which a FLEX method was applied to a conventional ordinary exposure process (using no pupil filter) for comparative purposes. In the simulation shown in FIGS. 16(A) and 16(B), the FLEX method was executed under the conditions that exposure was carried out at each of three discrete positions, and the distance between each pair of adjacent exposure positions was 1.5 μm. As will be clear from FIGS. 16(A) and 16(B), the image (dot-dash line) at the ±1 μm defocus position can be made close to the image (solid line) at the best focus position, that is, the focal depth can be increased, by jointly using an ordinary exposure process and a FLEX method. However, in the case of images [FIG. 16(A)] of contact hole patterns which are close to each other as shown in FIG. 13(A), the two contact holes cannot satisfactorily be separated, whereby the images of these holes are connected at a portion denoted by reference symbol n in FIG. 16(A), although two adjacent contact holes are completely separated in the case of images [FIG. 16(B)] of a plurality of contact hole patterns which are arranged relatively far away from each other as shown in FIG. 13(B). The reason for this is that the image intensity at a region between the two contact holes in FIG. 16(A) is close to Eth/2. It should be noted that in FIGS. 5 to 17(B), Eth/2 is assumed to be substantially corresponding to the amount of exposure at which an undesired reduction in film thickness begins on a positive photoresist. Accordingly, with a mere FLEX method, a portion of the photoresist that lies between the two contact holes is likely to reduce in thickness. In contrast, the images (shown in FIGS. 5 to 8 and 10 to 12) formed by the method according to this embodiment have a sufficiently small quantity of light in the region between the two contact holes and therefore have no likelihood of a reduction in film thickness of the photoresist.

FIGS. 17(A) and 17(B) show the results of simulation in which a conventional double focus type pupil filter (phase shift type pupil filter) alone was used. In FIGS. 17(A) and 17(B), simulation conditions (NA, λ, and σ) were the same as those described above, but a phase shift type filter formed under conditions different from those in the above-described embodiment was employed as a pupil filter. The radius r1 of the central region of the phase shift type filter was set at 0.4×r3, and the amplitude transmittance t1 was set at −1.0. Two contact hole patterns which were arranged relatively far away from each other as shown in FIG. 13(B) were used. FIG. 17(A) shows an optical image formed with no FLEX method used in combination with the pupil filter. FIG. 17(B)

shows an optical image formed by jointly using a FLEX method wherein exposure was carried out at each of two discrete positions spaced at a distance (3.5 μm) optimized for the above-described conditions.

The pupil filter employed in the simulation shown in FIGS. 17(A) and 17(B) is a conventionally proposed pupil filter having relatively strong double focus effect (focal depth enlarging effect). Therefore, even when no FLEX method is used in combination, the image (solid line) at the best focus position and the image (dot-dash line) at the ±1 μm defocus position are substantially superimposed on one another, as shown in FIG. 17(A). Thus, a large focal depth can be obtained. However, ringings (subpeaks occurring around proper contact hole images) are considerably large, and ringings occurring between the two contact holes are added together in a region therebetween to form an extremely bright ghost image. As a result, an unwanted contact hole pattern is transferred to a region between the two contact holes. Therefore, such a pupil filter cannot be used in actual practice. Further, even when a FLEX method is used in combination, as shown in FIG. 17(B), ringings are still large, although they are somewhat reduced. Therefore, the system cannot be used in actual practice.

In contrast to the above, the above-described embodiment uses a pupil filter which has relatively weak focal depth enlarging effect (i.e., r1/r2 or −t1/t2 is relatively small), and optimizes the pupil filter forming conditions and the conditions of a FLEX method used in combination with it. Therefore, it is possible to realize an extremely superior projection exposure apparatus which has a satisfactorily large focal depth, sufficiently reduced ringings, and improved capability of separating images of contact holes which are close to each other, as has already been shown in FIGS. 5 to 8, 10 to 12, 14(A) and 14(B).

In the above examples (simulations), the contact hole pattern on the reticle is 0.3 by 0.3 μm square (or diameter) in terms of measurement on the wafer, that is, in the case of a ⅕ reduction system, the contact hole pattern which is 1.5 by 1.5 μm square (or diameter) on the reticle is to be transferred into a pattern which is 0.3 by 0.3 μm square on the wafer. However, the size of the reticle pattern does not necessarily need to be the desired size in terms of measurement on the wafer. For example, transfer may be effected by adjusting the amount of exposure so that a contact hole pattern which is 2 by 2 μm square on the reticle and which is 0.4 by 0.4 μm square in terms of measurement on the wafer is transferred into a pattern which is 0.3 by 0.3 μm square on the wafer.

The projection exposure method according to this embodiment is not necessarily optimized with respect to contact holes which are 0.3 by 0.3 μm square, as a matter of course. It is therefore possible to transfer a contact hole pattern of any size with a satisfactory focal depth and exposure margin. Although the exposure light wave-length (illuminating light wavelength) is 0.365 μm and the numerical aperture of the projection optical system is 0.57 according to the conditions shown in the embodiment, the wavelength and the numerical aperture may assume any other values. For example, a KrF excimer laser light source (oscillation wavelength: 0.248 μm) may be used as a light source.

Further, the projection exposure apparatus according to the present invention may be used in combination with a halftone phase shift reticle, an edge emphasizing phase shift reticle. etc. which are disclosed in, for example, U.S. Pat. No. 4,890,309.

It should be noted that the present invention is not necessarily limited to the above-described embodiment, and that various changes and modifications may be imparted thereto without departing from the gist of the present invention.

What is claimed is:

1. A projection exposure method wherein a mask formed with a pattern for transfer is illuminated with illuminating light for exposure, and an image of said mask pattern is projected onto a photosensitive substrate through a projection optical system, said method comprising the steps of:

using a phase plate which is disposed on a Fourier transform plane of said projection optical system or on a plane near said Fourier transform plane, said phase plate including a circular region of radius r2 which is centered at an optical axis of said projection optical system and which allows said illuminating light to pass therethrough;

dividing said circular region into a central circular region of radius r1 (r1<r2) which is centered at the optical axis of said projection optical system, and a peripheral annular region which lies between a circle of radius r1 and a circle of radius r2, which are centered at said optical axis;

setting not only a ratio t (=t1/t2) of an amplitude transmittance t1 of illuminating light passing through said central circular region to an amplitude transmittance t2 of illuminating light passing through said peripheral annular region, at a value which is not larger than zero, but also a ratio r1/r2 of said radius r1 to said radius r2, at a value which is determined according to said amplitude transmittance ratio t;

when the pattern image of said mask is to be transferred onto said substrate by successively carrying out three divided exposure operations such that a position of said substrate relative to a position of an image-forming plane of said projection optical system is successively changed in the optical axis direction of said projection optical system by a distance d at a time, setting said distance d at a value which is determined according to a numerical aperture NA of said projection optical system and a wavelength λ of said illuminating light;

setting two amounts of exposure for two of said three divided exposure operations which are carried out at two opposite extremity positions of an exposure range in said optical axis direction such that said two amounts of exposure become substantially equal to each other; and setting one amount of exposure for one of said three divided exposure operations which is carried out at an intermediate position in said optical axis direction, at a value which is determined according to said distance d.

2. A method according to claim 1, wherein the ratio r1/r2 of said radius r1 to said radius r2 is set in a range determined by making allowances of ±15% for a value which is given by an expression of (0.34+0.12t) using said amplitude transmittance ratio t, and said distance d for said three divided exposure operations is set in a range of from 1 to 2 times a standard distance U which is determined according to the following expression using the wavelength λ of said illuminating light, and the substrate-side numerical aperture NA of said projection optical system:

$$U=\lambda/2\{1-(1-NA^2)^{1/2}\}$$

and wherein, assuming that a scale factor of said distance d with respect to said standard distance U is α (1<α<2), a ratio β1 of the amount of exposure at said intermediate exposure position to the amount of exposure at one of said two extremity exposure positions is set in a range determined by making allowances of ±5% for a value given by an expression of ($-2.14\alpha^2+7.37\alpha-5.15$).

3. A projection exposure apparatus wherein a mask formed with a pattern for transfer is illuminated with illuminating light for exposure, and an image of said mask pattern is projected onto a photosensitive substrate through a projection optical system, said apparatus comprising:

a phase plate which is disposed on a Fourier transform plane of said projection optical system or on a plane near said Fourier transform plane, said phase plate including a circular region of radius r2 which is centered at an optical axis of said projection optical system and which allows said illuminating light to pass therethrough, said circular region being divided into a central circular region of radius r1 (r1<r2) which is centered at the optical axis of said projection optical system, and a peripheral annular region which lies between a circle of radius r1 and a circle of radius r2, which are centered at said optical axis, wherein a ratio t (=t1/t2) of an amplitude transmittance t1 of illuminating light passing through said central circular region to an amplitude transmittance t2 of illuminating light passing through said peripheral annular region is set at a value which is not larger than zero, and a ratio r1/r2 of said radius r1 to said radius r2 is set at a value which is determined according to said amplitude transmittance ratio t;

a relative height control mechanism for moving said substrate and an image-forming plane of said projection optical system relative to each other in said optical axis direction; and an exposure control system for controlling an amount of exposure by which said substrate is exposed to said illuminating light;

wherein, when the pattern image of said mask is to be transferred onto said substrate by successively carrying out three divided exposure operations such that a position of said substrate relative to a position of the image-forming plane of said projection optical system is successively changed in said optical axis direction by a distance d at a time through said relative height control mechanism, said distance d is set at a value which is determined according to a numerical aperture NA of said projection optical system and a wavelength λ of said illuminating light; and two amounts of exposure for two of said three divided exposure operations which are carried out at two opposite extremity positions of an exposure range in said optical axis direction are set substantially equal to each other through said exposure control system, and an amount of exposure for one of said three divided exposure operations which is carried out at an intermediate position in said optical axis direction is set at a value which is determined according to said distance d through said exposure control system.

4. An apparatus according to claim 3, wherein the ratio r1/r2 of said radius r1 to said radius r2 is set in a range determined by making allowances of ±15% for a value which is given by an expression of (0.34+0.12t) using said amplitude transmittance ratio t; and said distance d for said three divided exposure operations is set in a range of from 1 to 2 times a standard distance U which is determined according to the following expression using the wavelength λ of said illuminating light, and the substrate-side numerical aperture NA of said projection optical system:

$$U=\lambda/[2\{1-(1-NA^2)^{1/2}\}]$$

and wherein, assuming that a scale factor of said distance d with respect to said standard distance U is α (1<α<2), a ratio β1 of the amount of exposure at said intermediate exposure position to the amount of exposure at one of said two extremity exposure positions is set in a range determined by making allowances of ±5% for a value given by an expression of ($-2.14\alpha^2+7.37\alpha-5.15$).

5. An apparatus according to claim 3 or 4, wherein there are a plurality of said phase plates, said phase plates being different from each other in the radius r1 of said central circular region, and said phase plates being alternatively disposed on or near said Fourier transform plane.

6. A projection exposure method wherein a mask formed with a pattern is irradiated with illuminating light, and an image of said mask pattern is projected onto a photosensitive substrate through a projection optical system, said method comprising the steps of:

disposing an optical filter on a Fourier transform plane in said projection optical system or on a plane near said Fourier transform plane, said optical filter having a central circular region which is centered at an optical axis of said projection optical axis, and an outer region which is provided outwardly of said central circular region so that an amplitude transmittance t1 of light passing through said central circular region is different from an amplitude transmittance t2 of light passing through said outer region; and projecting said pattern image onto said substrate by carrying out exposure when said substrate is successively rearranged at three different positions spaced in the optical axis direction of said projection optical system, such that amounts of exposure at two opposite extremity positions of said three positions in said optical axis direction are approximately equal to each other.

7. A method according to claim 6, wherein a distance d between each of the two extremity exposure positions and the exposure position intermediate between them is set in a range of from 1 to 2 times a standard distance U which is determined according to the following expression:

$$U=\lambda/[2\{1-(1-NA^2)^{1/2}\}]$$

where λ is a wavelength of said illuminating light, and NA is a substrate-side numerical aperture of said projection optical system.

8. A method according to claim 7, wherein, assuming that said distance d is α times (1<α<2) said standard distance U, a ratio β1 of the amount of exposure at said intermediate exposure position to the amount of exposure at one of said two extremity exposure positions is set in a range determined by making allowances of ±5% for a value given by an expression of ($-2.14\alpha^2+7.37\alpha-5.15$).

9. A method according to claim 6, wherein said optical filter is set so that a ratio t of the amplitude transmittance t1 of said circular region to the amplitude transmittance t2 of said outer region is not larger than zero; and wherein, assuming that a radius of said circular region is r1, and said outer region is an annular region having an inner radius r1 as well as an outer radius r2, a ratio r1/r2 of said radius r1 to said radius r2 is set within a range determined by making allowances of ±15% for a value given by an expression of (0.34+0.12t).

10. A projection exposure apparatus comprising:

an illumination system for irradiating a mask with illuminating light;

a projection optical system for projecting an image of a pattern on said mask onto a photosensitive substrate;

an optical filter which is disposed on a Fourier transform plane in said projection optical system or on a plane near said Fourier transform plane, said optical filter having central circular region which is centered at an optical axis of said projection optical system, and an outer region which is provided outwardly of said central circular region so that an amplitude transmittance t1 of light passing through said circular region is different from an amplitude transmittance t2 of light passing through said outer region;

a driving system for stepwisely moving said substrate in said optical axis direction of said projection optical system for projecting said pattern image when said substrate is successively rearranged at three different positions spaced in said optical axis direction; and a member for controlling an amount of exposure by which said mask is irradiated with said illuminating light so that amounts of exposure which are applied to said substrate by projection of said pattern image at two opposite extremity exposure positions in said optical axis direction are approximately equal to each other.

11. An apparatus according to claim 10, further comprising:

a transparent plate having an optical thickness which is approximately equal to that of said optical filter; and a member for retaining said transparent plate so that, when said optical filter is withdrawn from an image-forming optical path of said projection optical system, said transparent plate is disposed on the Fourier transform plane of said projection optical system or on a plane near said Fourier transform plane.

12. An apparatus according to claim 10, wherein said driving system includes:

a stage which is movable in said optical axis direction with said substrate retained thereon; and a member for driving said stage so that a distance d between each of the two extremity exposure positions and the exposure position intermediate between them is set in a range of from 1 to 2 times a standard distance U which is determined according to the following expression:

$$U=\lambda/[2\{1-(1-NA^2)^{1/2}\}]$$

where $\lambda$ is a wavelength of said illuminating light, and NA is a substrate-side numerical aperture of said projection optical system.

13. An apparatus according to claim 10, wherein, assuming that said distance d is a times ($1<\alpha<2$) said standard distance U, said control member sets a ratio of the amount of exposure at said intermediate exposure position to the amount of exposure at one of said two extremity exposure positions in a range determined by making allowances of ±5% for a value given by an expression of ($-2.14\alpha^2+7.37\alpha-5.15$).

14. An apparatus according to claim 10, wherein said optical filter is set so that a ratio t of the amplitude transmittance t1 of said central circular region to the amplitude transmittance t2 of said outer region is not larger than zero; and wherein, assuming that a radius of said central circular region is r1, and said outer region is an annular region having an inner radius r1 as well as an outer radius r2, a ratio r1/r2 of said radius r1 to said radius r2 is set within a range determined by making allowances of ±15% for a value given by an expression of (0.34+0.12t).

\* \* \* \* \*

UNITED STATES PATENT AND TRADEMARK OFFICE
CERTIFICATE OF CORRECTION

PATENT NO. : 5,621,500
DATED : April 15, 1997
INVENTOR(S) : Naomasa SHIRAISHI

It is certified that error appears in the above-indentified patent and that said Letters Patent is hereby corrected as shown below:

On the Title Page the Foriegn Application Priority Data has been ommitted. Please add --Japan, 6-112974, May 26, 1994-- as the Foreign Application Priority Data therefor.

Signed and Sealed this

Nineteenth Day of August, 1997

Attest:

BRUCE LEHMAN

Attesting Officer

Commissioner of Patents and Trademarks